United States Patent [19]
Kusumoto et al.

[11] Patent Number: 5,719,513
[45] Date of Patent: Feb. 17, 1998

[54] LATCH CIRCUIT FOR AMPLIFYING AN ANALOG SIGNAL AND CONVERTING AN ANALOG SIGNAL INTO A DIGITAL SIGNAL

[75] Inventors: Keiichi Kusumoto, Hyogo; Kenji Murata, Osaka; Akira Matsuzawa, Kyoto, all of Japan

[73] Assignee: Matsushita Electric Industrial Co., Ltd., Osaka, Japan

[21] Appl. No.: 699,808

[22] Filed: Aug. 20, 1996

Related U.S. Application Data

[63] Continuation of Ser. No. 497,472, Jun. 30, 1995, abandoned.

[30] Foreign Application Priority Data

Jul. 5, 1994 [JP] Japan .................. 6-153219

[51] Int. Cl.⁶ .................................. H03K 3/037
[52] U.S. Cl. .................................. 327/215; 327/219
[58] Field of Search .................. 327/108, 202, 327/203, 208, 210, 211, 212, 215, 218, 219, 259

[56] References Cited

U.S. PATENT DOCUMENTS

| | | | |
|---|---|---|---|
| 4,656,368 | 4/1987 | McCombs et al. | 327/202 |
| 4,691,122 | 9/1987 | Schnizlein et al. | 327/203 |
| 4,745,302 | 5/1988 | Hanawa et al. | 327/218 |
| 4,843,254 | 6/1989 | Motegi et al. | 327/203 |
| 5,189,315 | 2/1993 | Akata | 327/203 |
| 5,264,738 | 11/1993 | Veendrick et al. | 327/203 |
| 5,463,340 | 10/1995 | Takabatake et al. | 327/203 |

FOREIGN PATENT DOCUMENTS

| | | | |
|---|---|---|---|
| 61-293014 | 12/1986 | Japan . | |
| 63-80617 | 4/1988 | Japan . | |
| 402075218 | 3/1990 | Japan | 327/202 |
| 2-117205 | 5/1990 | Japan | 327/203 |
| 402205110 | 8/1990 | Japan | 327/218 |
| 405067949 | 3/1993 | Japan | 327/202 |
| 5-110391 | 4/1993 | Japan | 327/218 |
| 6-232704 | 8/1994 | Japan | 327/215 |

*Primary Examiner*—Timothy P. Callahan
*Assistant Examiner*—My-Trang Nu Ton
*Attorney, Agent, or Firm*—McDermott, Will & Emery

[57] ABSTRACT

The present invention discloses an improved latch circuit. In the latch circuit, a composite gate takes in a basic clock signal and a delayed clock signal which is delayed by a delay circuit for a specific amount with respect to the basic clock signal, and puts out to a second drive circuit a first signal identical in waveform with the basic block signal, and further puts out to a first drive circuit a second signal that is delayed in the rising timing with respect to the first signal. As a result of such arrangement, when a transition is made from a feedback period during which an input switch has an off state while a feedback switch has an on state to a sampling period during which the input switch has an on state while the feedback switch has an off state, neither the input switch nor the feedback switch has an on state.

14 Claims, 21 Drawing Sheets

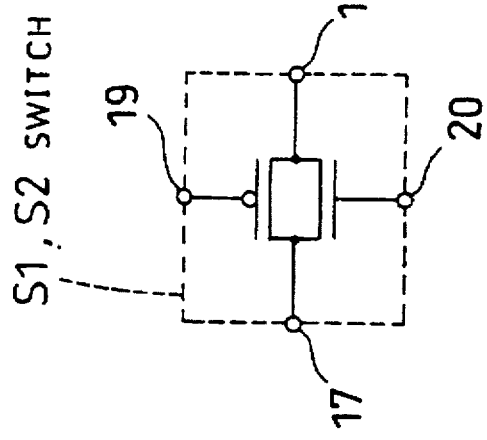
FIG.2(b) S1,S2 SWITCH
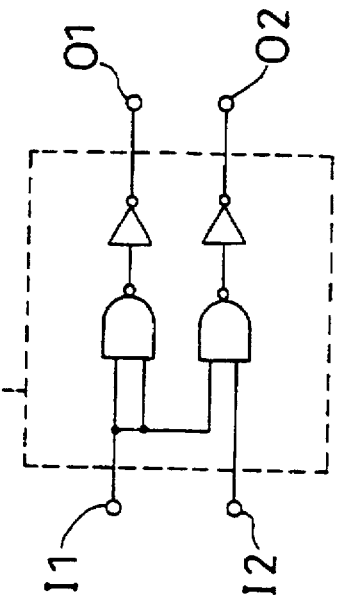
FIG.2(d) 8 COMPOSITE GATE
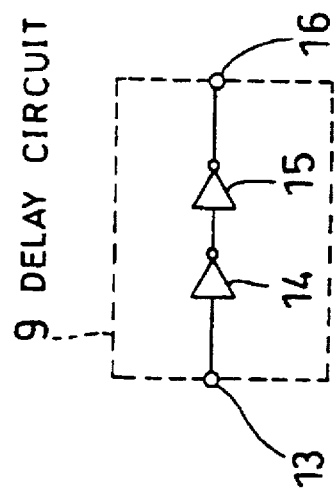
FIG.2(a) 9 DELAY CIRCUIT
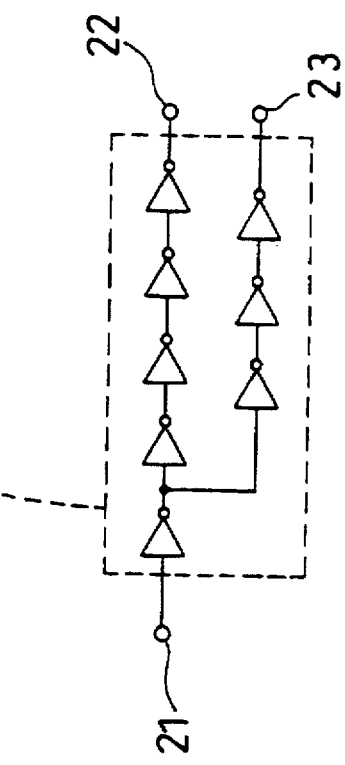
FIG.2(c) 6,7 DRIVE CIRCUIT

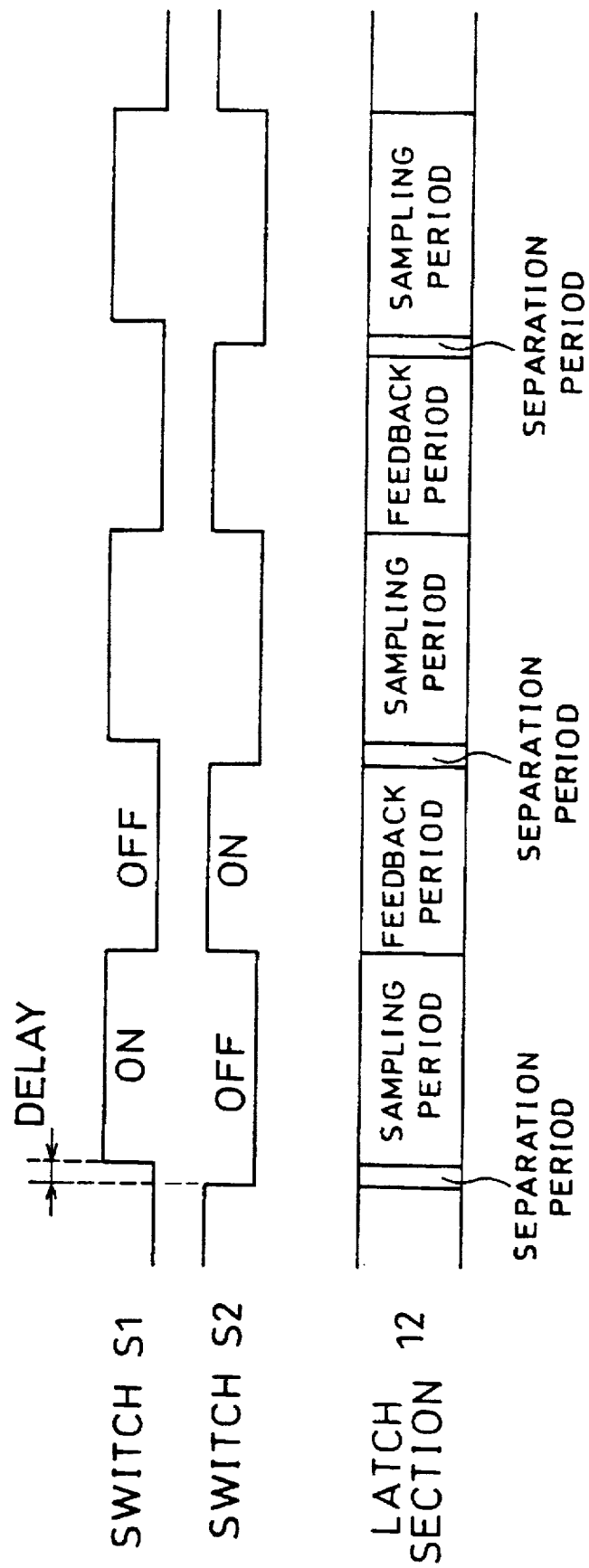

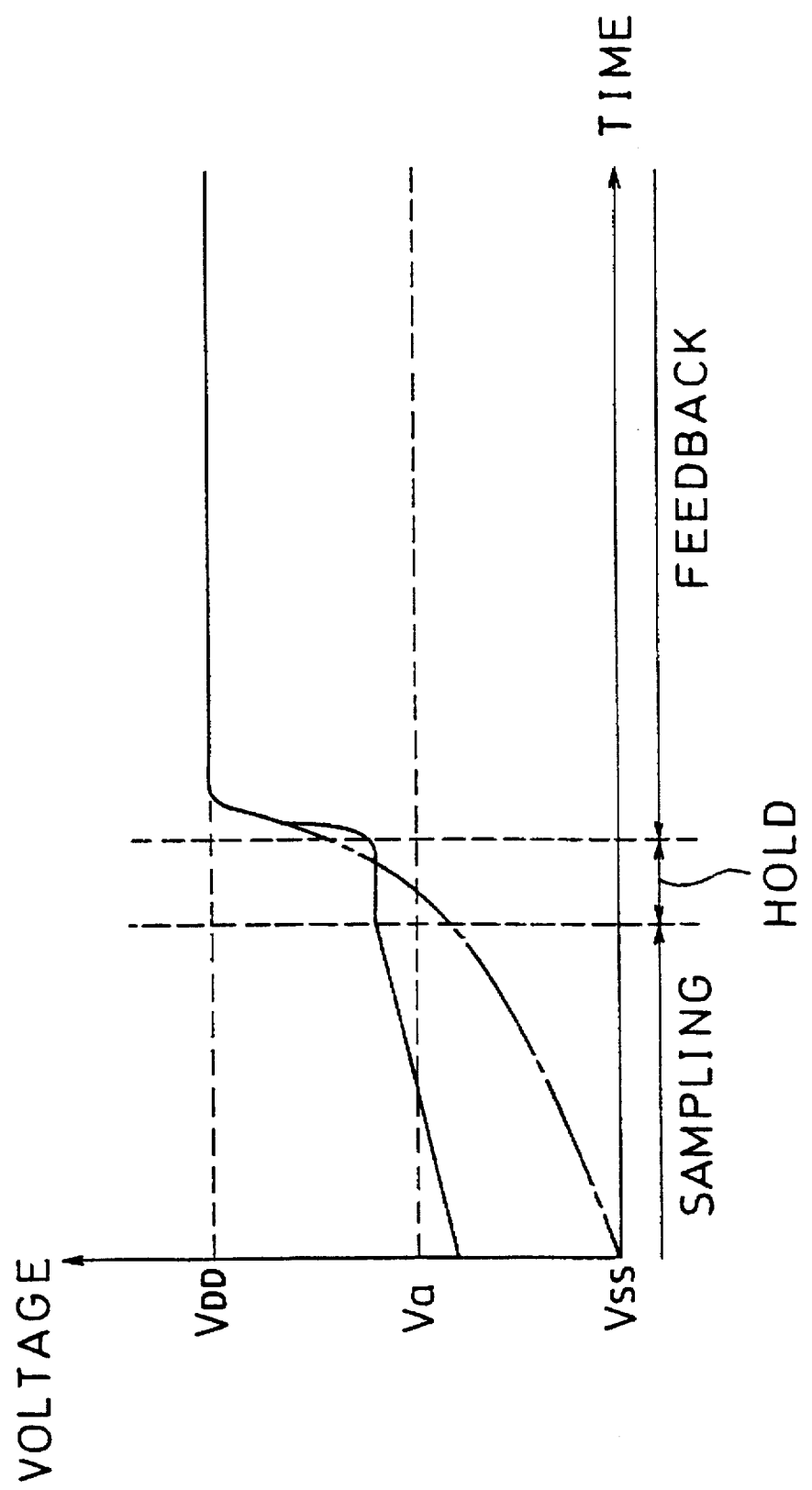

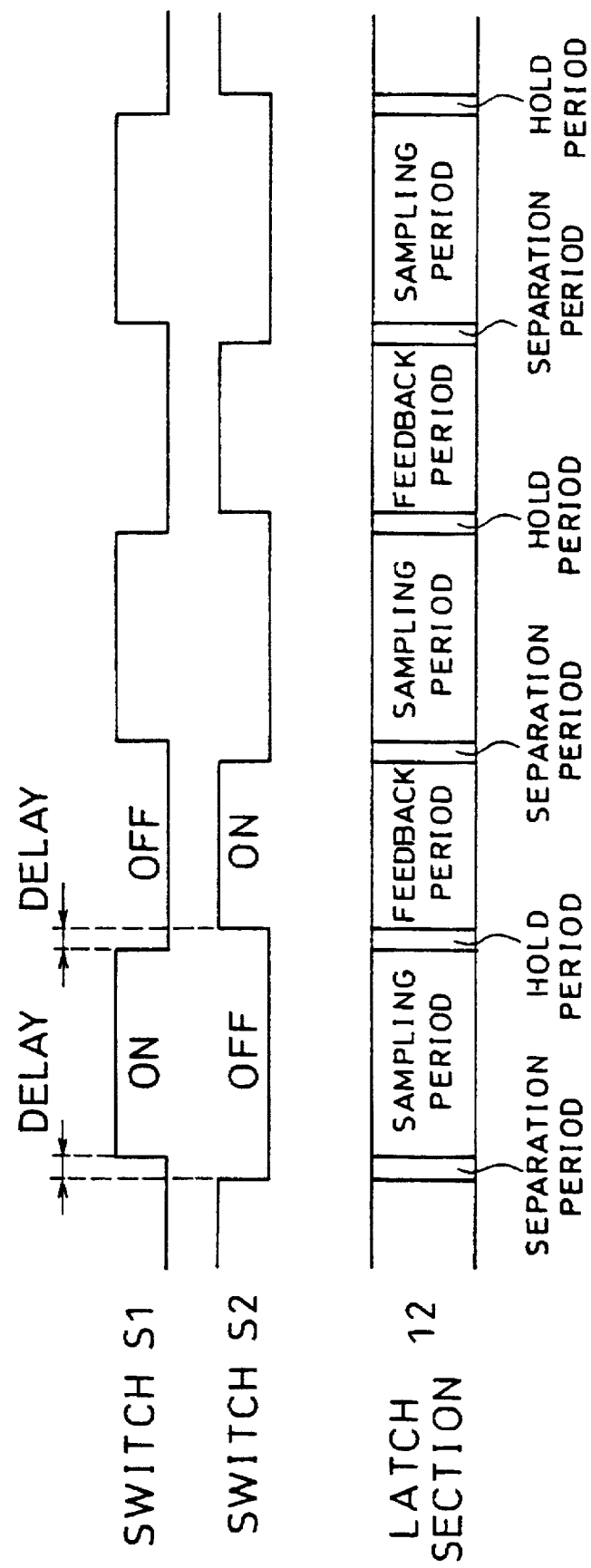

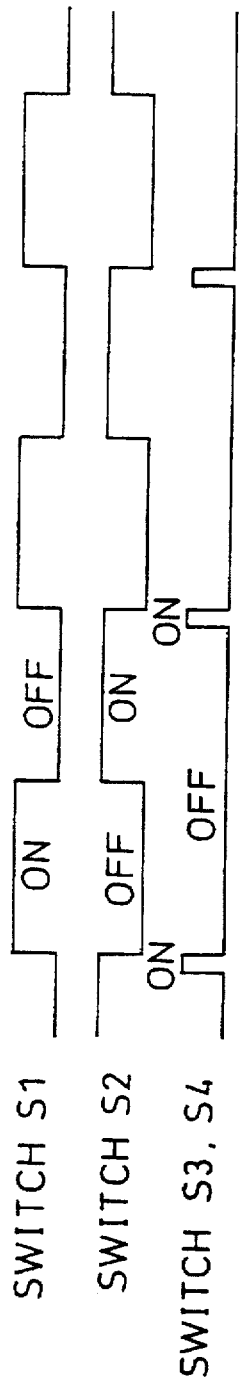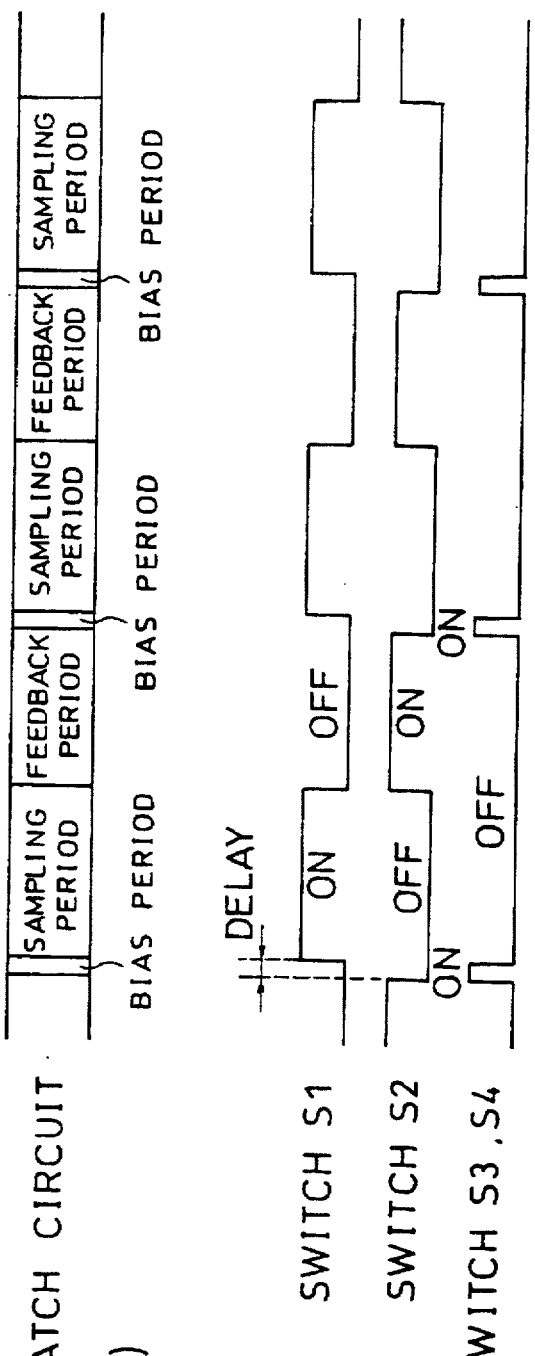
FIG. 19(a)
FIG. 19(b)

FIG.23
PRIOR ART
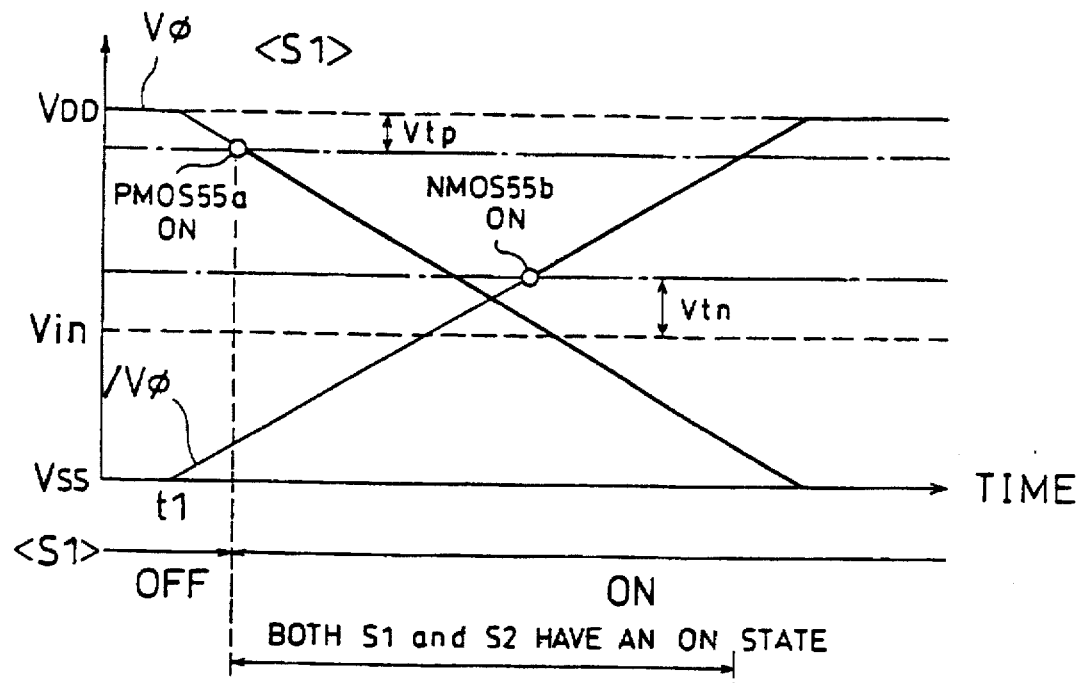
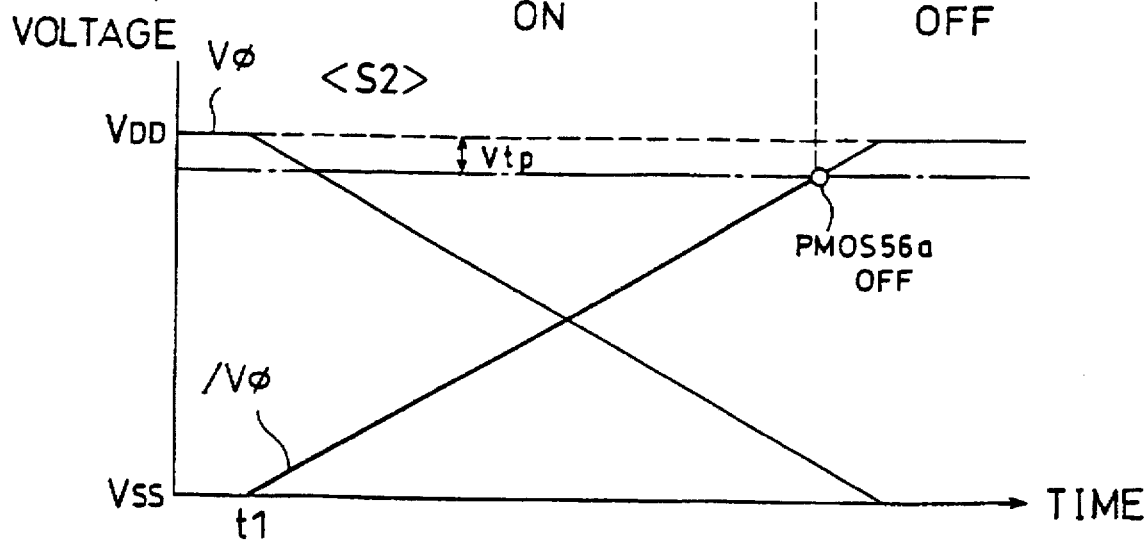

LATCH CIRCUIT FOR AMPLIFYING AN ANALOG SIGNAL AND CONVERTING AN ANALOG SIGNAL INTO A DIGITAL SIGNAL

This is a continuation application of application Ser. No. 08/497,472 filed Jun. 30, 1995, now abandoned.

BACKGROUND OF THE INVENTION

1. Field of the Invention

This invention pertains to a latch circuit for use in semiconductor integrated circuits.

2. Art Background

There have been demands for down-sized, lightweight electric appliances. Generally portable electric appliances for personal use are battery-powered. As the battery size becomes smaller the electric appliance becomes down-sized and lightweight. Therefore, decreasing the battery size requires low-power electronic circuit sections and mechanism sections. The semiconductor industry is thus now trying to produce low-power semiconductor integrated circuit devices.

Especially a low-power analog-to-digital converter for processing of video signals for use by portable video cameras is demanded. Therefore, for the purpose of accomplishing low power dissipation, a chopper inverter amplifier is often used in analog-to-digital (A/D) converters.

Japanese Patent Application, published under Pub. No. 63-80617, shows an A/D converter. A comparator is made up of a chopper inverter amplifier and a latch circuit that is located at a stage after the chopper inverter amplifier. This latch circuit includes two inverters (the first- and second-stage inverters) connected in series, an input switch connected between an input terminal of the first-stage inverter and an output terminal of the chopper inverter amplifier, and a feedback switch connected between the input terminal of the first-stage inverter and an output terminal of the second-stage inverter.

FIG. 22 illustrates a conventional latch circuit structure. 51 is an external input terminal. 52 is a first inverter. 53 is a second inverter. 54 is an external output terminal. An input switch S1 is made up of a PMOS 55$a$ and an NMOS 55$b$. A feedback switch S2 is made up of a PMOS 56$a$ and an NMOS 56$b$. Whereas a control voltage $V_\phi$ is applied to a gate of the PMOS 55$a$ and to a gate of the NMOS 56$b$, a control voltage /$V_\phi$ that is an inversion of the control voltage $V_\phi$ is applied to a gate of the NMOS 55$b$ and to a gate of the PMOS 56$a$.

If $V_\phi$ is HIGH, then /$V_\phi$ is LOW. Both the PMOS 55$a$ and the NMOS 55$b$ go into the nonconducting state, and the input switch S1 turns off. Meanwhile, both the PMOS 56$a$ and the NMOS 56$b$ go into the conducting state, and the feedback switch S2 turns on. This period is called a feedback period. If $V_\phi$ is LOW, then /$V_\phi$ becomes HIGH. The PMOS 55$a$ and the NMOS 55$b$ each go into the conducting state, and the input switch S1 turns on. On the other hand, the PMOS 56$a$ and the NMOS 56$b$ each go into the nonconducting state, and the feedback switch S2 turns off. This period is called a sampling period. In the FIG. 22 latch circuit, the input switch S1 and the feedback switch S2 make their transition at the same time.

If $V_{in}$ (the voltage applied at the external input terminal 51) is greater than $V_a$ (the first inverter's 52 threshold voltage) at the end of a sampling period, then an output voltage of the second inverter 53 is fed back in a positive feedback manner to become $V_{DD}$ (the supply voltage) in a feedback period. If $V_{in}$ is lower than $V_a$ at the end of a sampling period, then an output voltage of the second inverter 53 is fed back in a positive feedback manner to become $V_{SS}$ (the ground voltage) in a feedback period.

A conventional latch circuit, however, presents the following problems.

The inventors of the present application found that in actual latch circuit operations a phenomenon that the input switch S1 and the feedback switch S2 simultaneously have an on state occurs resulting in impeding high-speed, high-accuracy latch circuit operations.

The aforesaid phenomenon is explained in detail. FIG. 23 shows the operation of the input switch S1 as well as the operation of the feedback switch S2. As seen from FIG. 23, $V_\phi$ remains HIGH until time $t_1$, which is to say, the latch circuit is in a feedback period. Suppose $V_\phi$ begins making a HIGH-LOW transition at time $t_1$ and the latch circuit holds $V_{DD}$ in a feedback period.

Applied at terminals of the input switch S1 are $V_{in}$ applied at the external input terminal 51 and $V_{DD}$ held by the latch circuit. As shown in a graph (the above one) of FIG. 23, the PMOS 55$a$ of the input switch S1 conducts when $V_\phi$ becomes lower than $V_{DD}$ by $V_{tp}$ (the threshold voltage), and the NMOS 55$b$ of the input switch S1 conducts when /$V_\phi$ becomes greater than $V_{in}$ by $V_{tn}$ (the threshold voltage).

Applied at the terminals of the feedback switch S2 is $V_{DD}$ held by the latch circuit. As shown in a graph (the below one) of FIG. 23, the PMOS 56$a$ of the feedback switch S2 goes into the nonconducting state when /$V_\phi$ becomes lower than $V_{DD}$ by $V_{tp}$, and the NMOS 56$b$ of the feedback switch S2 remains nonconducting because it is impossible for $V_\phi$ to become greater than $V_{DD}$ by $V_{tn}$.

Accordingly, at the time when a feedback→sampling transition is made, there is a period during which both the input switch S1 and the feedback switch S2 simultaneously have an on state. Likewise at the time when a sampling→feedback transition is made, there is a period during which both the input switch S1 and the feedback switch S2 simultaneously have an on state.

The operation of the latch circuit is shown in FIG. 24. The FIG. 24 latch circuit has the first inverter 52, the second inverter 53, and the input switch S1, and the feedback switch S2. 61 is a preceding-stage amplifier. As shown in FIG. 24, there exists a first transitional period during which both the input switch S1 and the feedback switch S2 have an on state at the same time when there is made a feedback→sampling transition, while there exists a second transitional period during which both the input switch S1 and the feedback switch S2 have an on state at the same time when there is made a sampling→feedback transition.

The presence of the first transitional period produces some problems. FIG. 25 is a graph showing changes in the output voltage of the amplifier 61 in the first transitional period. The amplifier's 61 output voltage is represented by solid line and the second inverter's 53 output voltage is represented by dot-dash line. $V_a$ is the first inverter's 52 threshold voltage.

If in the feedback period the latch circuit holds $V_{DD}$, then the second inverter's 53 output voltage is $V_{DD}$. Suppose the amplifier 61 outputs a voltage of $V_{in}$ that is slightly lower than $V_a$. In the first transitional period, both the input switch S1 and the feedback switch S2 each have an on state, as a result of which the amplifier's 61 output voltage is driven to the second inverter 53 to go up to near $V_{DD}$. In the sampling period, the feedback switch S2 turns off, so that the amplifier's 61 output voltage is again driven to $V_{in}$. However, the amplifier's 61 output voltage has been increased to near $V_{DD}$ in the first transitional period, so that it needs a period of time known as the settling time to become $V_{in}$ again.

If a next feedback operation is performed during the settling time, then the latch circuit is likely to hold $V_{DD}$ although $V_{in}$ was lower than $V_a$. This prolongs the length of the sampling period because the settling time must be included therein. More specifically, 10-15 ns is required, thereby producing a bar to high-speed latch circuit operations.

The presence of the second transitional period, too, produces some problems. FIG. 26 is a graph showing changes in the input voltage of the first inverter 52 in the second transitional period. The first inverter's 52 input voltage is represented by solid line and the second inverter's 53 output voltage is represented by dot-dash line. $V_a$ is the first inverter's 52 threshold voltage.

If in the sampling period the first inverter's 52 output voltage changes from a certain voltage level below $V_a$ to a higher level, the second inverter's 53 output voltage changes with a delay with respect to the first inverter's 52 input voltage. If the latch circuit goes into the second transitional period when the first inverter's 52 input voltage exceeds $V_a$ and when the second inverter's 53 output voltage is below $V_a$, both the input switch S1 and the feedback switch S2 have an on state and the first inverter's 52 input voltage is driven to the second inverter 53 to become lower than $V_a$.

Accordingly the latch circuit comes to hold $V_{SS}$ in the feedback period although the first inverter's 52 input voltage was higher than $V_a$ at the end of the sampling period. The accuracy of latch circuit operation is reduced.

SUMMARY OF THE INVENTION

Bearing in mind the above-described problems with the prior art techniques, the present invention was made.

Accordingly an object of the present invention is to provide an improved latch circuit capable of high-speed, high-accuracy operations by preventing the input switch and the feedback switch from having at the same time an on state.

The present invention provides a latch circuit comprising:

an external input terminal for accepting a voltage coming in from outside the latch circuit;

a noninverting amplifier with an input terminal and an output terminal for amplifying the voltage in a noninverting amplification manner;

a first switch means which is connected between the external input terminal and the input terminal of the noninverting amplifier and which is capable of having either an on state for establishing a connection between the external input terminal and the input terminal of the noninverting amplifier or an off state for establishing a disconnection between the external input terminal and the input terminal of the noninverting amplifier;

a second switch means which is connected between the input terminal and the output terminal of the noninverting amplifier and which is capable of having either an on state for establishing a connection between the input and output terminals of the noninverting amplifier or an off state for establishing a disconnection between the input and output terminals of the noninverting amplifier;

a control means for controlling the on/off state of the first switch means and the on/off state of the second switch means in such a way as to prevent both the first switch means and the second switch means from having an on state at the same time when the first switch means and the second switch means together make their respective state transitions.

In accordance with this latch circuit, it is arranged such that the first and second switch means do not have at the same time an on state. This eliminates a period for the noninverting amplifier to drive a voltage coming in from the external input terminal. Input voltage disturbance occurring in a conventional latch circuit can be controlled thereby improving the rate and accuracy of latch circuit operation.

In the above-described latch circuit, the control means may include:

a first drive means for driving the first switch means for setting the state thereof;

a second drive means for driving the second switch means for setting the state thereof;

a delay means for receiving a first signal and delaying same to generate a second signal;

a signal generation means which receives the first signal and the second signal, to generate a third signal prompting the first switch means to change state, the generated third signal being forwarded to the first drive means, and to generate a fourth signal prompting the second switch means to change state, the generated fourth signal being forwarded to the second drive means.

In the above-described latch circuit, the noninverting amplifier may comprise an even number of inverting amplifiers connected in series. The latch circuit may include a capacitor with two terminals, one of which being connected to an input terminal of a first-stage inverting amplifier of the inverting amplifiers and the other of which being connected to an output terminal of the first-stage inverting amplifier. The provision of the capacitor reduces the effect of a parasitic capacitor. This reduces not only the error voltage in the input voltage of the latch circuit but also the error voltage variation due to the semiconductor integrated circuit fabrication process.

The latch circuit may include a capacitor with two terminals, one of which being connected to an input terminal of a last-stage inverting amplifier of the inverting amplifiers and the other of which being connected to an output terminal of the last-stage inverting amplifier. The provision of the capacitor reduces the effect of the operation of a circuit located at a stage after the latch circuit, and voltage transition disturbance in a latch circuit feedback operation can be controlled.

The latch circuit may include a capacitor with two terminals, one of which being connected to an input terminal of the noninverting amplifier and the other of which being connected to an output terminal of the noninverting amplifier. The provision of the capacitor reduces the effect of a parasitic capacitor. This reduces not only the error voltage in the input voltage of the latch circuit but also the error voltage variation due to the semiconductor integrated circuit fabrication process.

The present invention provides a latch circuit comprising:

an external input terminal for accepting a voltage coming in from outside the latch circuit;

a noninverting amplifier with an input terminal and an output terminal, consisting of N inverting amplifiers connected in series, where the number N is even, for amplifying the voltage in a noninverting amplification manner;

a first switch means which is connected between the external input terminal and the input terminal of the noninverting amplifier and which is capable of having either an on state for establishing a connection between the external input terminal and the input terminal of the noninverting amplifier or an off state for establishing a disconnection between the external input terminal and the input terminal of the noninverting amplifier;

a second switch means which is connected between the input terminal and the output terminal of the noninverting amplifier and which is capable of having either an on state for establishing a connection between the input and output terminals of the noninverting amplifier or an off state for establishing a disconnection between the input and output terminals of the noninverting amplifier;

N bias switch means each of which is connected between an input terminal and an output terminal of each inverting amplifier, each bias switch means being capable of having either an on state for establishing a connection between an input and an output terminal of each inverting amplifier or an off state for establishing a disconnection between an input and an output terminal of each inverting amplifier.

The above-described latch circuit may include a control means for controlling the on/off state of the first switch means and the on/off state of the second switch means in such a way as to prevent both the first switch means and the second switch means from having an on state at the same time when the first switch means and the second switch means together make their respective state transitions.

In accordance with the latch circuit described above, with the bias switch means having an on state, the input and output terminals of the inverting amplifier are connected together. As a result, both the input and output voltages of the inverting amplifier become the inverting amplifier's threshold voltage. At this point in time, when there is made a transition from a feedback period during which the first switch means has an on state while the second switch means has an off state to a sampling period during which the first switch means has an off state while the second switch means has an on state, each bias switch means is made to have an on state prior to such a feedback→sampling transition. As a result, a voltage, held by the latch circuit in the feedback period, changes to a threshold voltage, and the settling time taken for setting a voltage applied at the external input terminal to a final voltage in a sampling period is not affected by a difference in the voltage held by the latch circuit in the preceding feedback period.

The noninverting amplifier may include (N−1) capacitors connected in series between an output terminal of an ith-stage inverting amplifier of the N inverting amplifiers and an input terminal of an (i+1)th-stage inverting amplifier of the N inverting amplifiers, where the number i is an integer satisfying a condition of $1 \leq i \leq (N-1)$. This capacitor is able to hold a difference between a threshold voltage of an inverting amplifier and that of an adjoining inverting amplifier. This reduces the inverting amplifier threshold voltage variation thereby improving the accuracy of latch circuit operation.

BRIEF DESCRIPTION OF THE DRAWINGS

FIG. 2, comprised of FIGS. 2a, 2b, 2c, and 2d, shows structural elements of the first latch circuit of FIG. 1, wherein FIG. 2a shows a delay circuit, and FIG. 2b shows a switch device, and FIG. 2c shows a drive circuit, and FIG. 2d shows a composite gate.

FIG. 5 is a timing diagram useful in understanding the operation of a latch section of the first latch circuit.

FIG. 10 is a graph showing changes in the voltage applied at an external input terminal, in the operation of the latch section of the second latch circuit.

FIG. 11, comprised of FIGS. 11a and 11b, shows structural elements of a third latch circuit in accordance with the present invention, wherein

FIG. 14 is a timing diagram useful in understanding the operation of a latch section of the third latch circuit.

FIG. 19, comprised of FIGS. 19a and 19b, wherein FIG. 19a is a timing diagram useful in understanding the operation of a latch section of the seventh latch circuit and FIG. 19b is a timing diagram useful in understanding the operation of the seventh latch circuit employed as a latch section in the first latch circuit.

FIG. 23 shows the operation of an input switch as well as the operation of a feedback switch in a conventional latch circuit.

DETAILED DESCRIPTION OF THE PREFERRED EMBODIMENTS

Figure 1:
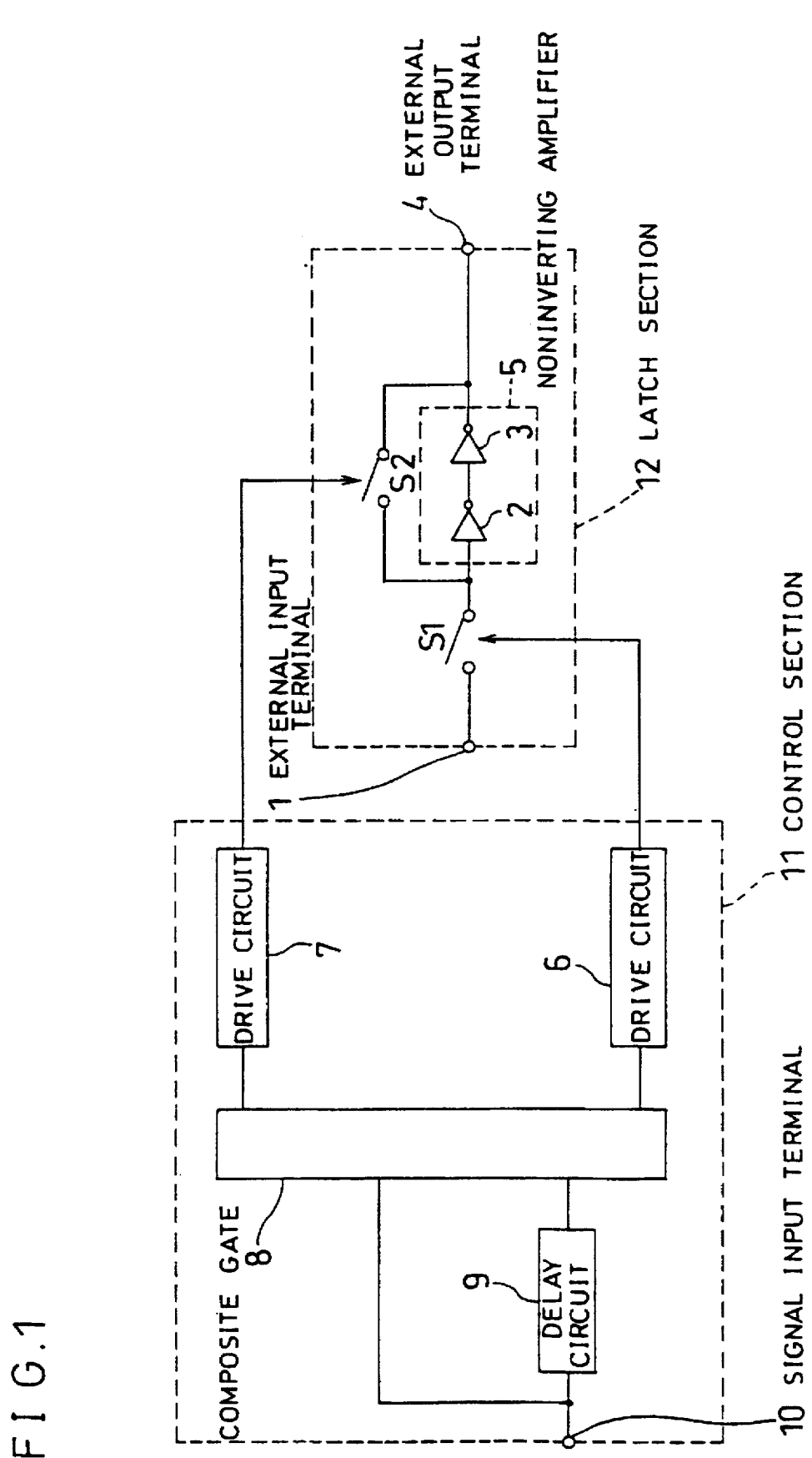
FIG. 1 is a block diagram outlining a structure of a first latch circuit in accordance with the present invention.

In the following description, a latch circuit in accordance with the present invention comprises an inverter, a switch, a logical circuit, a delay circuit, and the like. An inverter is formed by a circuit which takes in a positive voltage and puts out a negative one, or vice versa such as a CMOS inverter, an E/D inverter, and an NMOS inverter. A switch is formed by a CMOS switch, an NMOS switch, or a PMOS switch.

Referring now to the drawing figures, preferred embodiments of the present invention are described below.

Embodiment 1

FIG. 1 outlines a first latch circuit of the present invention. The first latch circuit has a latch section 12 formed by an external input terminal 1, a first inverter 2, a second inverter 3, an external output terminal 4, an input switch S1 as a first switch means, and a feedback switch S2 as a second switch means. The first and second inverters 2 and 3 together form a noninverting amplifier 5. The input switch S1 is connected between the external input terminal 1 and an input terminal of the first inverter 2. When the input switch S1 has an on state, an input voltage applied at the external input terminal 1 is fed to the first inverter 2. The first inverter 2 is associated with the input switch S1 and acts as an amplifier for input voltage inverting amplification. The second inverter 3 is connected in series to the first inverter 2 and acts as an amplifier for inversion-amplifying an output voltage of the first inverter 2. The feedback switch S2 is connected between the input terminal of the first inverter 2 and an output terminal of the second inverter 3. When the feedback switch S2 has an on state, an output voltage of the second inverter 3 is fed back in a positive feedback manner to the first inverter 2 via the feedback switch S2. The external output terminal 4 is an output terminal at which an output voltage of the second inverter 3 is put out to outside the latch circuit.

Additionally the first latch circuit has a control section 11 comprising a first drive circuit 6, a second drive circuit 7, a composite gate 8 as a signal generation means, a delay circuit 9, and a signal input terminal 10. Whereas the first drive circuit 6 is operable to turn on or off the input switch S1, the second drive circuit 7 is operable to turn on or off the feedback switch S2. The composite gate 8 accepts a signal from the signal input terminal 10 and a signal from the delay circuit 9 and performs a logical operation on the signals received. The signal input terminal 10 is an input terminal for accepting a basic clock signal based on which each operation period of the latch section 12 is determined.

FIG. 2a is a circuit diagram depicting an example of the delay circuit 9. As shown in the figure, the delay circuit 9 is made up of a first-stage inverter 14 and a second-stage inverter 15 connected together in series. A sum of the time taken for a pulse to traverse the inverter 14 and the time taken for a pulse to traverse the inverter 15 is the delay circuit's 9 delay time. Since the number of inverters to be connected in series is designed to be even, a signal taken in at an input terminal 13 and a signal put out at an output terminal 16 have the same polarity.

FIG. 2b is a circuit diagram showing an example of the switch S1 (S2). Since the input switch S1 and the feedback switch S2 are identical in configuration with each other, only the input switch S1 is described here. As shown in FIG. 2b, the input switch S1 is a transmission gate formed by a PMOS transistor and an NMOS transistor. The input switch S1 has input terminals 17, 18 and control terminals 19, 20. The FIG. 2b switch is turned on or off by control signals applied at the control terminals 19 and 20.

FIG. 2c is a circuit diagram showing an example of the drive circuit 6 (7). Since the drive circuits 6 and 7 are identical circuits, only the drive circuit 6 is described here. As shown in FIG. 2c, the drive circuit 6 is formed by an in-series connection path consisting of five inverters connected in series and a branch path consisting of three inverters connected in series and branching off at the output side of a first-stage inverter of the in-series connection path. The drive circuit 6 has an input terminal 21, an inverting output terminal 22, and a noninverting output terminal 23. If a signal, taken in at the input terminal 21, is transmitted through the in-series connection path, an inverting signal is put out at the inverting output terminal 22. On the other hand, if a signal is transmitted first through the first-stage inverter and then through the branch path, a noninverting signal is put out at the noninverting output terminal 23. These noninverting and inverting signals are applied as control signals to the terminals 19 and 20 of the FIG. 2b switch, respectively.

FIG. 2d is a circuit diagram showing an example of the composite gate 8. As shown in FIG. 2d, this composite gate 8 is made up of a first NAND gate with two input terminals associated with a terminal I1, a first inverter which is connected to a stage after the first NAND gate and which has an output terminal associated with a terminal 01, a second NAND gate with two input terminals respectively associated with the terminal I1 and a terminal I2, and a second inverter which is connected to a stage after the second NAND gate and which has an output terminal associated with a terminal 02.

Figure 3:
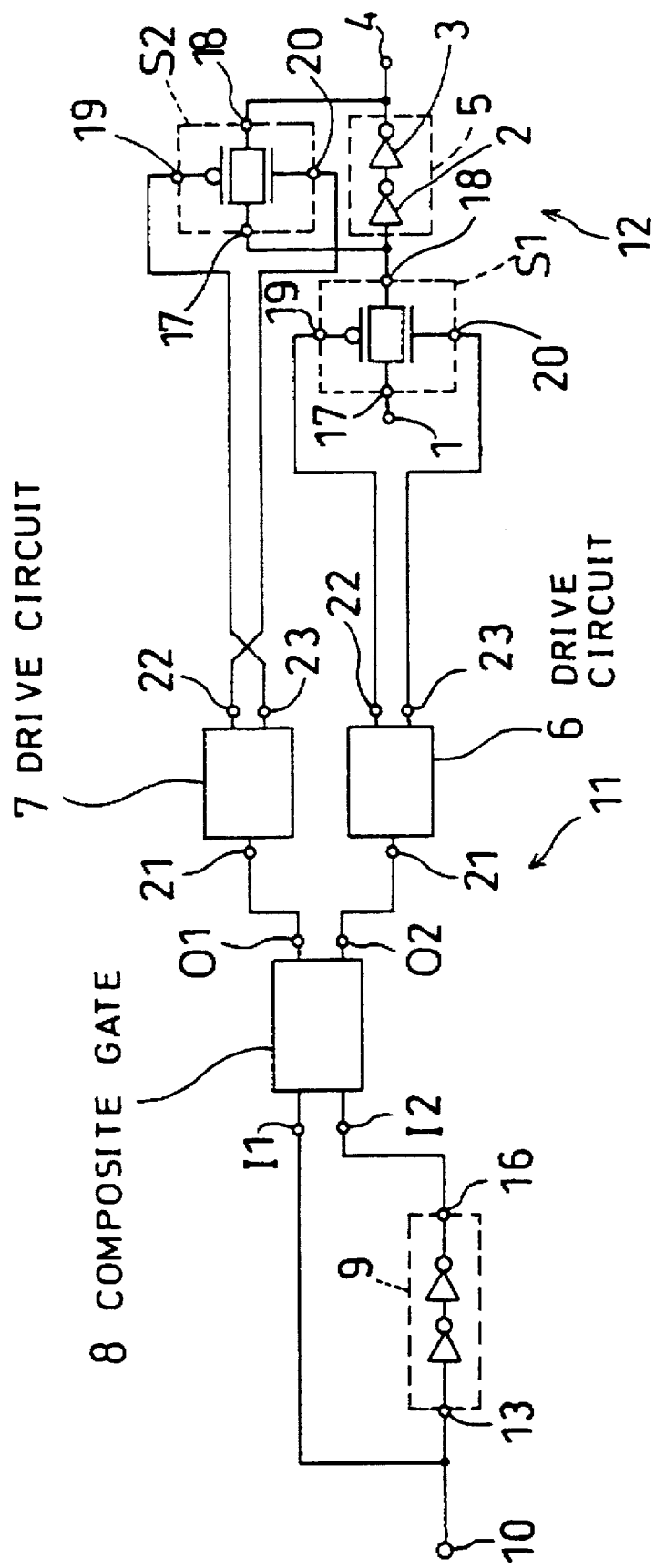
FIG. 3 is a circuit diagram showing an embodiment of the first latch circuit.

FIG. 3 is an embodiment of the first latch circuit. This embodiment is implemented employing the FIG. 2a delay circuit, the FIG. 2b switch, the FIG. 2c drive circuit, and the FIG. 2d composite gate.

In the latch section 12, the terminal 17 of the input switch S1 is connected to the external input terminal 1 and the terminal 18 thereof is connected to the input terminal of the noninverting amplifier 5. The terminal 17 of the feedback switch S2 is connected to the input terminal of the noninverting amplifier 5 and the terminal 18 thereof is connected to the output terminal of the noninverting amplifier 5.

In the control section 11, the input terminal 13 of the delay circuit 9 is connected to the signal input terminal 10. The terminal I1 of the composite gate 8 is connected to the signal input terminal 10 and the terminal I2 is connected to the output terminal 16 of the delay circuit 9. The terminal 01 of the composite gate 8 is connected to the input terminal 21 of the second drive circuit 7 and the terminal 02 thereof is connected to the input terminal 21 of the first drive circuit 6. The inverting output terminal 22 of the first drive circuit 6 is connected to the terminal 19 of the input switch S1 and the noninverting output terminal 23 thereof is connected to the terminal 20 of the input switch S1. The inverting output terminal 22 of the second drive circuit 7 is connected to the terminal 20 of the feedback switch S2 and the noninverting output terminal 23 thereof is connected to the terminal 19 of the feedback switch S2. The internal organization of each of the first drive circuit 6, the second drive circuit 7, and the composite gate 8 is not shown in FIG. 3.

Figure 4:
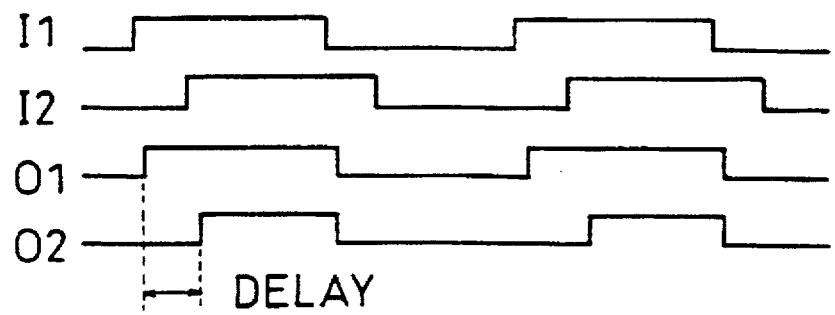
FIG. 4 is an input/output signal timing diagram for a composite gate included in the first latch circuit.

The operation of the first latch circuit is explained by making reference to FIGS. 4 and 5.

FIG. 4 is an input/output signal timing diagram for the composite gate 8. A basic clock signal is directly applied to the terminal I1 of the composite gate 8 from the signal input terminal 10. This basic clock signal is also indirectly applied to the terminal I2 of the composite gate 8 via the delay circuit 9. In other words, the terminal I2 accepts a delayed clock signal that is delayed by means of the delay circuit 9 a specific amount with respect to the basic clock signal. The composite gate 8 puts out at the terminal 01 a first signal identical in waveform with the basic clock signal. The composite gate 8 further puts out at the terminal 02 a second signal that is delayed only in the rising timing with respect to the first signal.

The first drive circuit 6 generates from a signal from the terminal 02 of the composite gate 8 a noninverting signal and an inverting signal, for on-off controlling of the input switch S1. Likewise the second drive circuit 7 generates from a signal from the terminal 01 of the composite gate 8 a noninverting signal and an inverting signal, for on-off controlling of the feedback switch S2.

FIG. 5 is a timing diagram showing the operation of the latch section 12. As shown in FIG. 5, the latch section 12 is characterized in that there is established a separation period between a feedback period and a sampling period, during which both the input switch S1 and the feedback switch S2 have an off state.

In the sampling period, the input switch S1 has an on state while on the other hand the feedback switch S2 has an off state. In this situation, the first inverter 2 takes in a voltage, applied at the external input terminal 1, as its input voltage. The first inverter 2 inversion-amplifies this input voltage on the basis of $V_a$ (the threshold voltage). This inversion-amplified voltage is further inversion-amplified by the second inverter 3 and is put out. A voltage that the first inverter 2 takes in and a voltage that the second inverter 3 puts out have the same polarity on the basis of $V_a$.

In the feedback period, the input switch S1 has an off state while the feedback switch S2 has an on state. The on/off state of the input switch S1 and the on/off state of the feedback switch S2 are switched simultaneously. Upon completion of such switching, an output voltage of the second inverter 3 is fed back, in a positive feedback manner, to the input terminal of the first inverter 2 by way of the feedback switch S2 that is now in the on state. Because of such positive feedback, an input voltage of the first inverter 2 and an output voltage of the second inverter 3 are driven to the supply voltage or ground voltage. Therefore a voltage that the external input terminal 1 accepts at the end of the sampling period is driven to the supply voltage or ground voltage on the basis of $V_a$ (i.e., the first inverter's 2 threshold voltage), and is put out from the external output terminal 4.

Next, the input switch S1 stays off while the feedback switch S2 makes an on→off transition. Such a situation where both the input switch S1 and the feedback switch S2 have an off state is called a separation period. The provision of the separation period prevents the input switch S1 and the feedback switch S2 from simultaneously having an on state. Although a conventional latch circuit produces the phenomenon that in the feedback→sampling transition a voltage that the external input terminal 1 accepts is driven towards a voltage held by the second inverter 3 in the feedback period, the present invention, as a result of the foregoing arrangement, prevents the occurrence of such a phenomenon. Additionally this enables a circuit located at a preceding stage to the latch circuit to operate without distortion.

Figure 6:
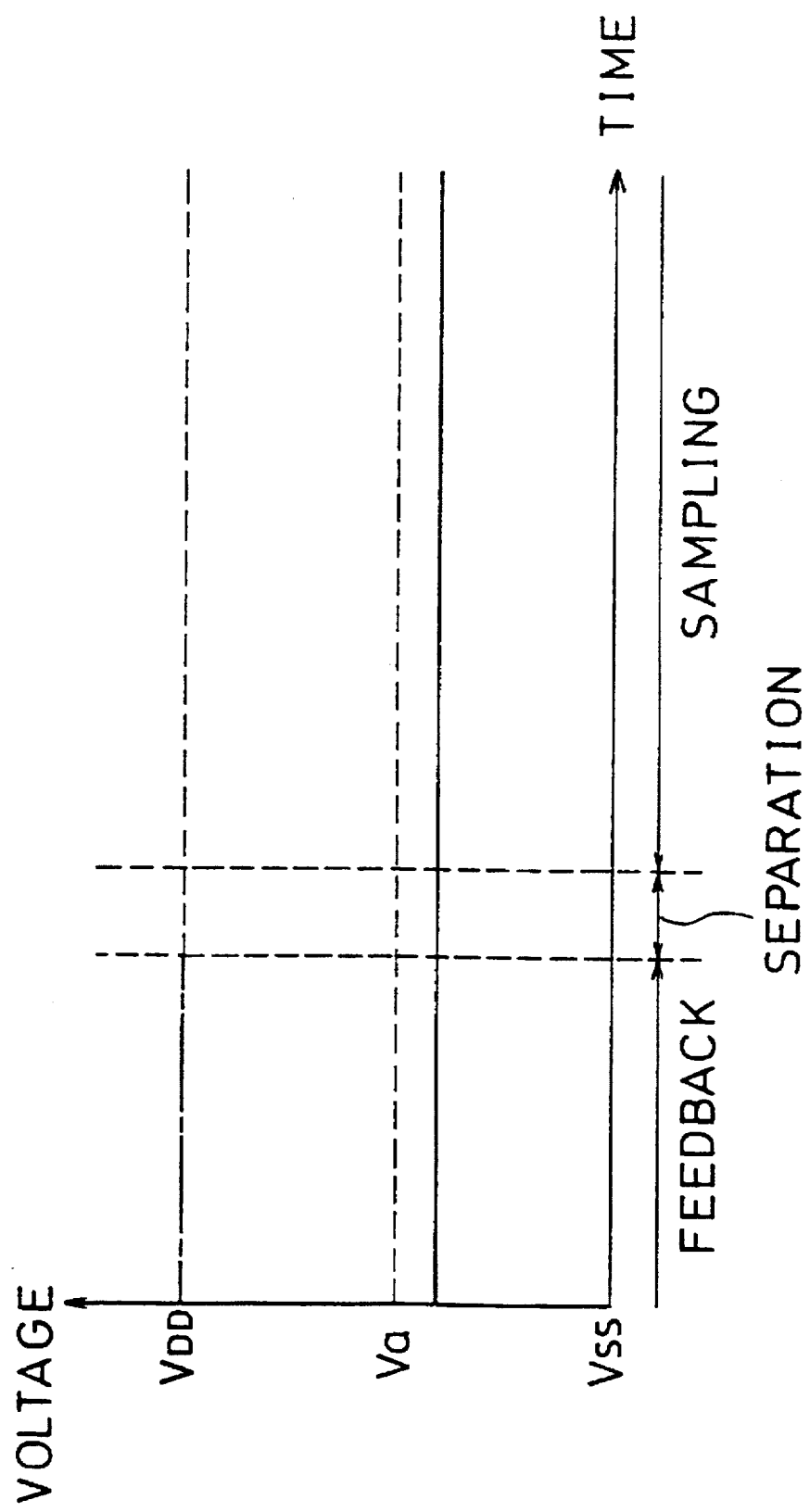
FIG. 6 is a graph showing changes in the voltage applied at an external input terminal, in the operation of the latch section of the first latch circuit.

FIG. 6 is a graph showing changes in the voltage applied at the external input terminal 1 in a feedback→sampling transition. In FIG. 6, the voltage applied at the external input terminal 1 is represented by solid line and the voltage held by the second inverter 3 in the feedback period is represented by dot-dash line. As seen from FIG. 6, a voltage applied at the external input terminal 1 is not affected by a voltage held by the second inverter 3 in the feedback period because there is provided a separation period. Since the settling time can be reduced, this provides fast latch operations. A separation period of, say, about 1.5 ns will produce sufficient effects. Therefore the separation period can be set much lower than the settling time (10–15 ns).

In accordance with the first latch circuit, the control section 11, consisting of the first drive circuit 6, the second drive circuit 7, the composite gate 8, and the delay circuit 9, controls in an active manner the operation order of the switches S1 and S2 of the latch section 12, and a separation period is established between a feedback period and a sampling period. This arrangement not only allows a circuit located at a preceding stage to the latch circuit to operate without distortion but also enables high-speed latch operations.

Embodiment 2

Referring to the drawing figures, a second latch circuit of the present invention is described below.

Figure 7:
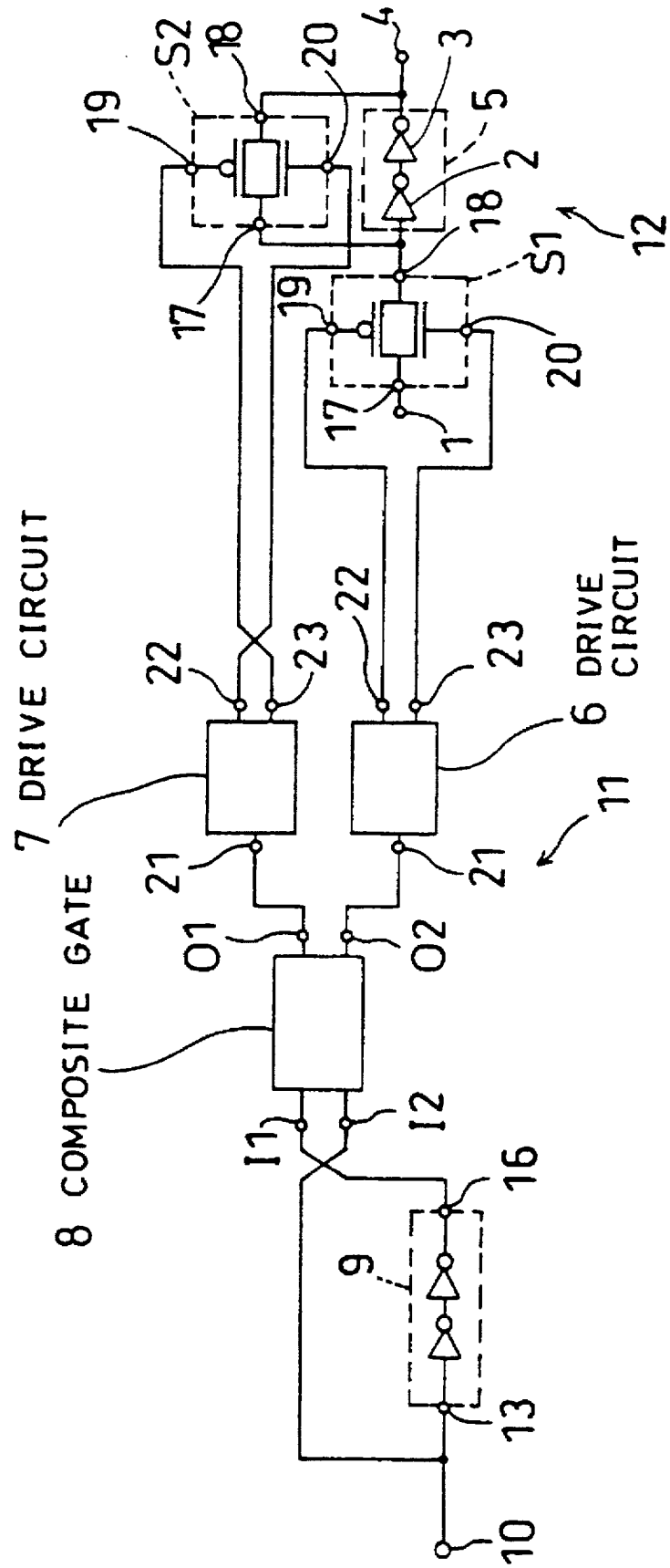
FIG. 7 illustrates an embodiment of a second latch circuit in accordance with the present invention.

FIG. 7 illustrates an embodiment of the second latch circuit. As in the first embodiment, the second latch circuit is made up of different circuits as shown in FIG. 2. Only features of the second latch circuit are described here.

In the first embodiment (see FIG. 3), the terminal I1 of the composite gate 8 is connected to the signal input terminal 10 while the terminal I2 thereof is connected to the output terminal 16 of the delay circuit 9. In the second latch circuit, however, the terminal I2 of the composite gate 8 is connected to the signal input terminal 10 while the terminal I1 thereof is connected to the output terminal 16 of the delay circuit 9. With the exception of such connection differences, the second latch circuit is identical in configuration with the first latch circuit. Elements in the second embodiment, which are functionally equivalent to their counterparts of the first embodiment, are thus assigned the same reference numerals and they are not described in detail here accordingly.

Figure 8:
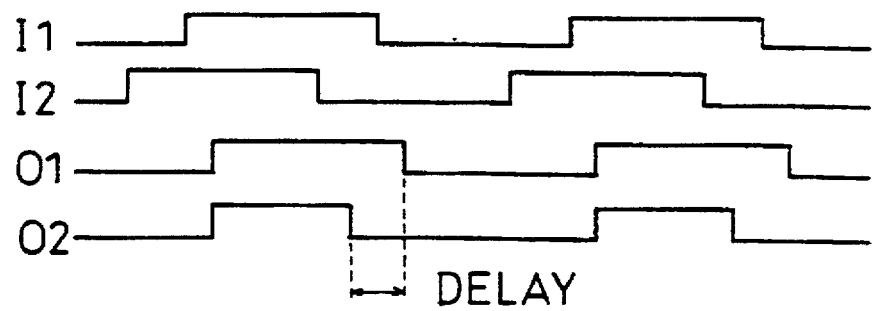
FIG. 8 is an input/output signal timing diagram for a composite gate included in the second latch circuit.
Figure 9:
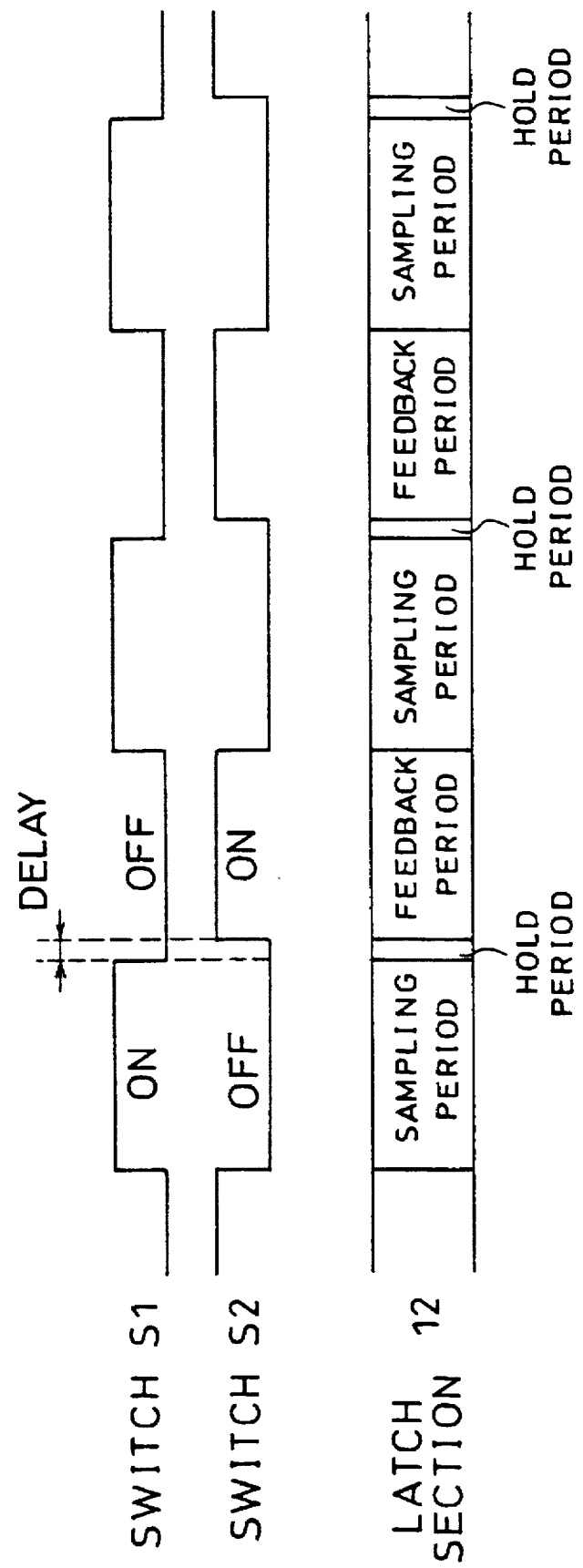
FIG. 9 is a timing diagram useful in understanding the operation of a latch section of the second latch circuit.

By making reference to FIGS. 8 and 9, how the second latch circuit operates is explained.

FIG. 8 is an input/output signal timing diagram for the composite gate 8. As shown in FIG. 8, a delayed clock signal that is delayed by the delay circuit 9 for a specific amount with respect to a basic clock signal is applied to the terminal I1 of the composite gate 8. The terminal I2 of the composite gate 8 accepts a basic clock signal directly from the signal input terminal 10. Thereafter the composite gate 8 provides a first signal identical in waveform with the basic clock signal at the terminal 01. The composite gate 8 further puts out a second signal that is advanced only in the falling timing with respect to the first signal, at the terminal 02.

The first drive circuit 6 generates from a signal from the terminal 02 of the composite gate 8 a noninverting signal and an inverting signal for on-off controlling of the input switch S1. Likewise the second drive circuit 7 generates from a signal from the terminal 01 of the composite gate 8 a noninverting signal and an inverting signal for on-off controlling of the feedback switch S2.

FIG. 9 is a timing diagram showing the operation of the latch section 12. As shown in FIG. 9, the latch section 12 is characterized in that there is established a hold period between a sampling period and a feedback period, during which both the input switch S1 and the feedback switch S2 have an off state.

Neither the sampling period operation nor the feedback operation is not described here since they are identical with their counterparts of the first embodiment. Accordingly only the hold period operation is described.

In a sampling→feedback transition, the feedback switch S2 stays off while the input switch S1 makes an on→off transition. Such a situation where both the input switch S1 and the feedback switch S2 are in the off state is called a hold period. The provision of the hold period prevents the input switch S1 and the feedback switch S2 from simultaneously having an on state. Although a conventional latch circuit produces the phenomenon that in a sampling→feedback transition a voltage applied at the external input terminal 1 is driven towards a voltage provided by the second inverter 3 in a sampling period, the present invention, as a result of the foregoing arrangement, prevents the occurrence of such a phenomenon. Additionally this enables a circuit located at a preceding stage to the latch circuit to operate without distortion.

FIG. 10 is a graph showing changes in the input voltage of the first inverter 2 in a sampling→feedback transition. In FIG. 10, the input voltage of the first inverter 2 is represented by solid line and the output voltage of the second inverter 3 is represented by dot-dash line. In the hold period, an input voltage of the first inverter 2 is not affected by an output voltage of the second inverter 3, being maintained at the same level as at the end of the sampling period. Since the first inverter 2 takes in a voltage greater than $V_a$ (i.e., the first inverter's 2 threshold voltage), this causes the second inverter 3 to provide a supply voltage in a feedback period. This provides improvements in latch circuit operation accuracy.

In accordance with the second latch circuit, the control section 11, consisting of the first drive circuit 6, the second drive circuit 7, the composite gate 8, and the delay circuit 9, controls in an active manner the operation order of the switches S1 and S2 of the latch section 12, and a hold period is established between a sampling period and a feedback period. This arrangement not only enables a circuit located at a preceding stage to the latch circuit to operate without distortion but also improves the accuracy of latch circuit operation.

Embodiment 3

By making reference to the drawing figures, a third latch circuit of the present invention is described below.

Figure 11A:
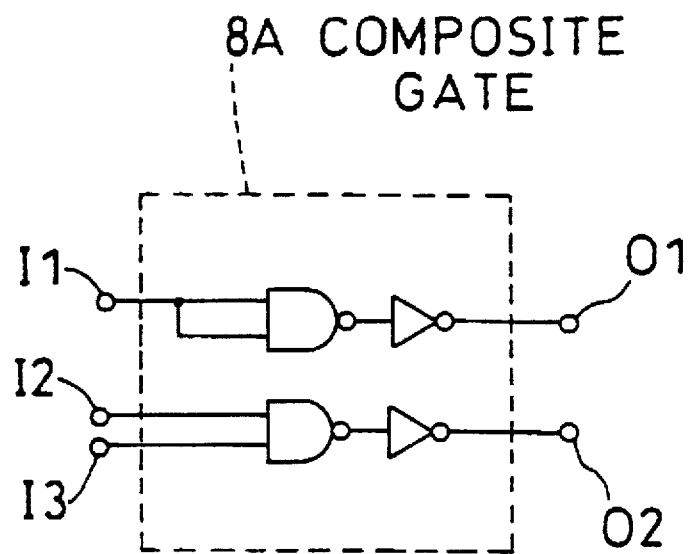
FIG. 11a shows a composite gate and FIG. 11b shows a delay circuit.

FIG. 11a shows an example of a composite gate 8A for use in the third latch circuit. As shown in FIG. 11a, the composite gate 8A is composed of a first NAND gate with two input terminals both connected to a terminal I1, a first inverter which is connected to the next stage after the first NAND gate and which has an output terminal connected to a terminal 01, a second NAND gate with two input terminals, one of which being connected to a terminal I2 and the other being connected to a terminal I3, and a second inverter which is connected to the next stage after the second NAND gate and which has an output terminal connected to a terminal 02.

Figure 11B:
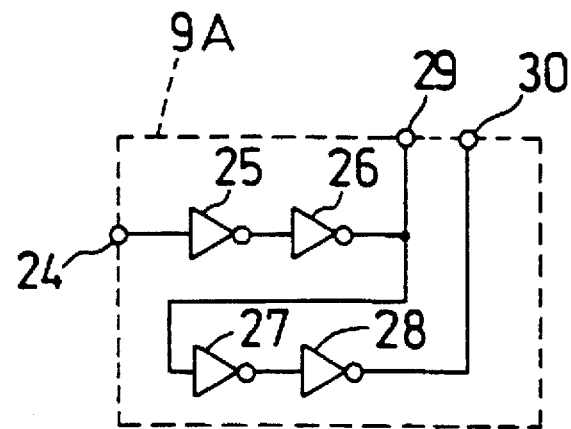

FIG. 11b shows an example of a delay circuit 9A employed in the third latch circuit. As shown in FIG. 11b, the delay circuit 9A is composed of a first delay section circuit of inverters 25 and 26 connected in series and a second delay section circuit of inverters 27 and 28 connected in series, the first and second delay sections being connected together in series. A sum of the time taken for a pulse to traverse the inverter 25 and the time taken for a pulse to traverse the inverter 26 is defined as the first delay time, and a sum of the time taken for a pulse to traverse the inverter 27 and the time taken for a pulse to traverse the inverter 28 is defined as the second delay time. Since the number of inverters to be connected in series in each of the first and second delay section circuits is designed to be even, a signal applied at an input terminal 24 and signals provided at output terminals 29 and 30 are the same in polarity.

Figure 12:
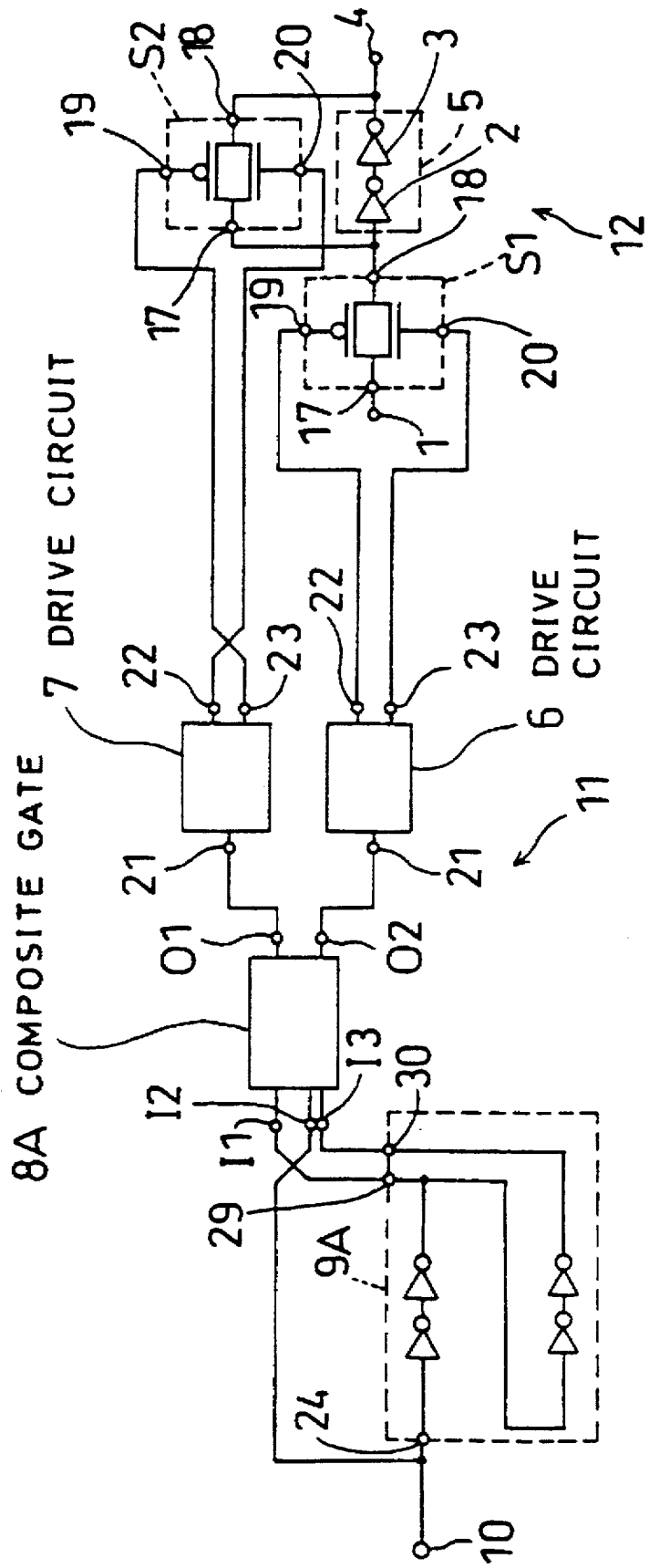
FIG. 12 shows an embodiment of the third latch circuit.

FIG. 12 shows an embodiment of the third latch circuit wherein FIG. 2b switches are used as the input switch S1 and as the feedback switch S2. FIG. 2c drive circuits are used as the first drive circuit 6 and as the second drive circuit 7, a FIG. 11a composite gate is used as the composite gate 8A, and a FIG. 11b delay circuit is used as the delay circuit 9A.

In the control section 11, the input terminal 24 of the delay circuit 9A is connected to the signal input terminal 10. The terminal I1 of the composite gate 8A is connected to the output terminal 29 of the delay circuit 9A, and the terminal I2 is connected to the signal input terminal 10, and the terminal I3 is connected to the output terminal 30 of the delay circuit 9A. The terminal 01 of the composite gate 8A is connected to the input terminal 21 of the second drive circuit 7 and the terminal 02 is connected to the input terminal 21 of the first drive circuit 6. With the exception of such interconnection relationships the second latch circuit is identical in organization with the first and second latch circuits. Elements in the third embodiment, which are functionally equivalent to their counterparts of FIGS. 1, 3, 7, are thus assigned the same reference numerals and they are not described in detail here accordingly.

Figure 13:
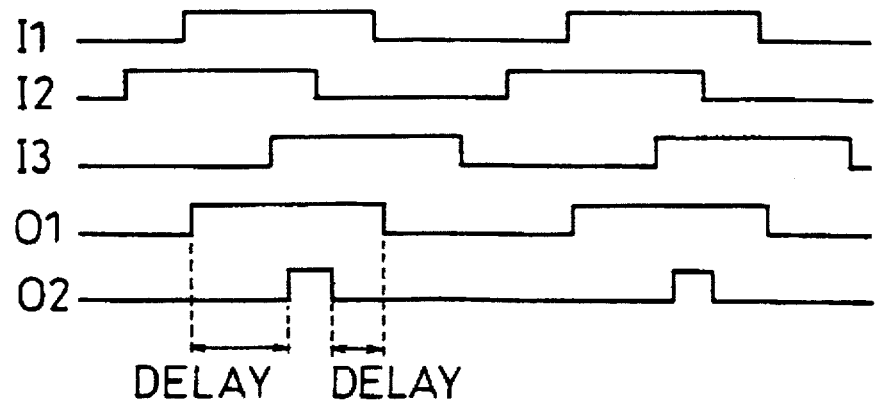
FIG. 13 is an input/output signal timing diagram for a composite gate included in the second latch circuit.

Referring now to FIGS. 13 and 14, the operation of the third latch circuit is described below.

FIG. 13 is an input/output signal timing diagram for the composite gate 8A. A basic clock signal is delayed by the first delay section circuit of the delay circuit 9A by the first delay time, thereafter being applied as a first delayed clock signal to the terminal I1 of the composite gate 8A. The terminal I2 of the composite gate 8A accepts a basic clock signal directly from the signal input terminal 10. The first delayed clock signal is further delayed by the second delay section circuit of the delay circuit 9A by the second delay time, thereafter being applied as a second delayed clock signal to the terminal I3 of the composite gate 8A. The composite gate 8A operates to provide a first signal identical in waveform with the basic clock signal at the terminal 01. The composite gate 8A further provides, at the terminal 02, a second signal that is delayed in the rising timing and advanced in the falling timing with respect to the first signal.

The first drive circuit 6 generates from a signal from the terminal 02 of the composite gate 8 a noninverting signal and an inverting signal for on-off controlling of the input switch S1. Likewise the second drive circuit 7 generates from a signal from the terminal 01 of the composite gate 8 a noninverting signal and an inverting signal for on-off controlling of the feedback switch S2.

FIG. 14 is a timing diagram showing the operation of the latch section 12 of the third latch circuit. As shown in FIG. 14, the latch section 12 is characterized in that there is established not only a separation period between a feedback period and a sampling period during which both the input switch S1 and the feedback switch S2 have an off state but also a hold period between a sampling period and a feedback period during which both the input switch S1 and the feedback switch S2 have an off state. In the sampling, feedback, separation, and hold periods, the latch section 12 of the third latch circuit operates in the same way that the first and second latch circuits operate and the operation of each period is not described here.

In accordance with the third latch circuit, the control section 11, consisting of the first drive circuit 6, the second drive circuit 7, the composite gate 8A, and the delay circuit 9A, controls in an active manner the operation order of the switches S1 and S2 of the latch section 12, and a separation period between a feedback period and a sampling period as well as a hold period between a sampling period and a feedback period is provided. This arrangement not only enables a circuit located at a preceding stage to the latch circuit to operate without distortion but also increases the rate and accuracy of latch circuit operation.

Embodiment 4

With reference to the drawing figures, a fourth latch circuit of the present invention is now described below.

Figure 15:
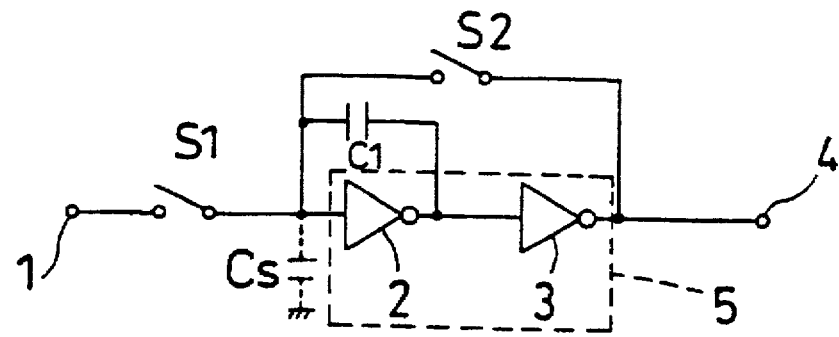
FIG. 15 illustrates a latch section of a fourth latch circuit in accordance with the present invention.

FIG. 15 is a circuit diagram of a latch section of the fourth latch circuit. The latch section of the fourth latch circuit is identical in configuration with the latch section 12 of the first latch circuit of FIG. 1 except that the present latch section has a capacitor C1 connected between the input and output terminals of the first inverter 2. The capacitor C1 is provided to reduce the degree of affection produced by a parasitic capacitor Cs between the input terminal of the first inverter 2 and ground. Elements of FIG. 15, which are functionally equivalent to their counterparts of FIG. 1, are thus assigned the same reference numerals and they are not described in detail here accordingly.

The latch section of the fourth latch circuit may find applications in any one of the first, second, and third latch circuits. However, a case where the present latch section is used in the second latch circuit is described here because the effect of the capacitor C1 is demonstrated most characteristically when employed in the second latch circuit (see FIG. 9).

Here $V_a$ is the first inverter's 2 threshold voltage and G is the voltage gain in the vicinity of $V_a$ (G<0). In the sampling period, $V_{in}$ (i.e., a voltage applied at the external input terminal 1) is applied to one terminal of the capacitor C1, and a voltage of $G \times (V_{in} - V_a) + V_a$ is applied to the other terminal thereof. Therefore $q_S$ (i.e., the amount of electric charge held by the capacitor C1) is given as follows.

$$q_S = C1 \times (V_{in} - (G \times (V_{in} - V_a) + V_a)) \quad (1)$$

$q_{SS}$ (i.e., the amount of electric charge held by the parasitic capacitor Cs connected between the input terminal of the first inverter 2 and ground) is given as follows.

$$q_{SS} = Cs \times V_{in} \quad (2)$$

In the hold period, an input voltage of the first inverter 2 is set to a voltage of $V_H$. The first inverter 2 then provides a voltage of $G \times (V_H - V_a) + V_a$. The as-provided voltage (i.e., $G \times (V_H - V_a) + V_a$) of the first inverter 2 becomes a terminal voltage of the capacitor C1. Therefore $q_{SH}$ (the amount of electric charge distributed to the capacitor C1) is given as follows.

$$q_{SH} = C1 \times (V_H - (G \times (V_H - V_a) + V_a)) \quad (3)$$

Further $q_{SSH}$ (the amount of electric charge held by the parasitic capacitor Cs) is given as follows.

$$q_{SSH} = Cs \times V_H \quad (4)$$

Both in the sampling period and in the hold period, the conservation of charge holds at a point where the capacitor C1 and the parasitic capacitor Cs are connected together. Here, $q_f$, which is the amount of electric charge injected, at the time when a transition to a hold period is made, into the point by charge redistribution accompanied with movement between power sources of terminal voltages of parasitic capacitors in the switches S1 and S2, is added to a formula expressing the conservation of charge, for obtaining circuit characteristics as close as possible to actual ones.

$$q_S + q_{SS} + q_f = q_{SH} + q_{SSH} \quad (5)$$

Formulas (1)–(4) are substituted in Formula (5), to make an arrangement on $V_H$. As a result of such a substitution, the following is obtained.

$$V_H = V_{in} + q_f / (Cs + (1 - G) \times C1) \quad (6)$$

In the absence of C1, C1=0 in the formula (6). Therefore:

$$V_H = V_{in} + q_f / Cs \quad (7)$$

The second terms of the right sides of the formulas (6) and (7), that is, $q_f/(Cs+(1-G) \times C1)$ and $q_f/Cs$, each represent an error voltage of $V_H$ versus $V_{in}$. As can be seen from comparing the formula (6) with the formula (7), the presence of C1 reduces the value of error voltage. In other words, the capacitor C1 contributes to lowering an error voltage.

In actual latch circuits, there are variations in the parasitic capacitor Cs due to fabrication steps of the semiconductor integrated circuit. Because of this, the error voltage varies greatly in an actual latch circuit. Conversely the capacitor C1 controls the parasitic capacitor Cs variation and can be formed having a greater value than the parasitic capacitor Cs. The presence of the capacitor C1 reduces the effect of the parasitic capacitor Cs. $V_H$ can be approximately expressed as follows.

$$V_H = V_{in} + q_f / ((1 - G) \times C1) \quad (\therefore Cs \ll (1-G) \times C1) \quad (8)$$

Therefore the error voltage of the second term of the right side becomes independent on the parasitic capacitor Cs, whereupon the error voltage variation is reduced.

Thereafter the latch circuit performs a feedback operation according to $V_H$. In order to perform high-accuracy operations, the error voltage must be kept as low as possible.

In accordance with the fourth latch circuit, the capacitor C1 is connected between the input and output terminals of the first inverter 2. As a result of the provision of the capacitor C1, error voltage can be controlled in the hold period, and the variation in the error voltage due to fabrication steps of the semiconductor integrated circuit can be controlled.

Embodiment 5

Figure 16:
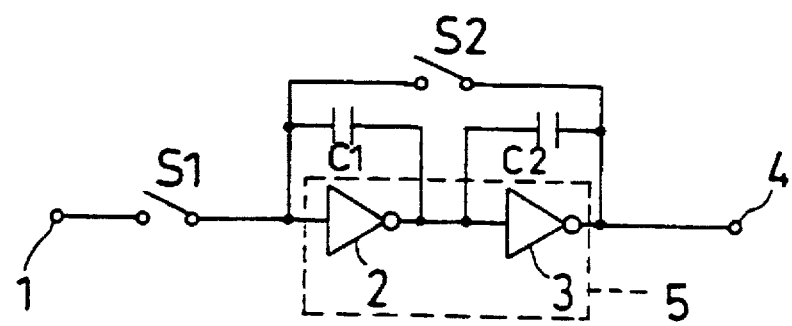
FIG. 16 illustrates a latch section of a fifth latch circuit in accordance with the present invention.

A fifth latch circuit of the present invention is now described by making reference to FIG. 16.

FIG. 16 shows a latch section of the fifth latch circuit. The latch section of the fifth latch circuit is characterized in that a capacitor C2 is connected between the input and output terminals of the second inverter 3 so as to prevent a circuit, located at the next stage after the latch circuit, from affecting the latch circuit. Elements of FIG. 16, which are functionally equivalent to their counterparts of FIG. 15, are thus assigned the same reference numerals and they are not described in detail here accordingly.

The latch section of the fifth latch circuit may find applications either in the second latch circuit or in the third latch circuit. However, the operation of the present latch section is described when employed in the first latch circuit of FIG. 3.

The effect of the capacitor C2 characteristically appears when the output voltage of the latch circuit makes a transition in the feedback operation. In a circuit consisting of the second inverter 3 and the capacitor C2, the capacitor C2 acts as a feedback circuit network. When a voltage, which is generated at the time when a circuit connected to the next stage after the latch circuit operates, appears at the external output terminal 4, such a generated voltage is then applied to the input terminal of the second inverter 3 via the capacitor C2 and is inversion-amplified. Because of such arrangement, disturbance voltage from a stage after the latch circuit can be prevented. This reduces the effect of the operation of a circuit after the latch circuit with respect to the output voltage of the latch circuit and controls voltage transition disturbance occurring when the latch circuit is in a feedback operation.

The latch section of the fifth latch circuit may be used in the second or third latch circuit with the same effect.

In accordance with the fifth latch circuit, the capacitor C2 is connected between the input and output terminals of the second inverter 3. Such an arrangement not only reduces the effect of the operation of a circuit after the latch circuit with respect to the output voltage of the latch circuit but also controls voltage transition disturbance occurring when the latch circuit is in a feedback operation and increases the accuracy of latch circuit operation.

Embodiment 6

Figure 17:
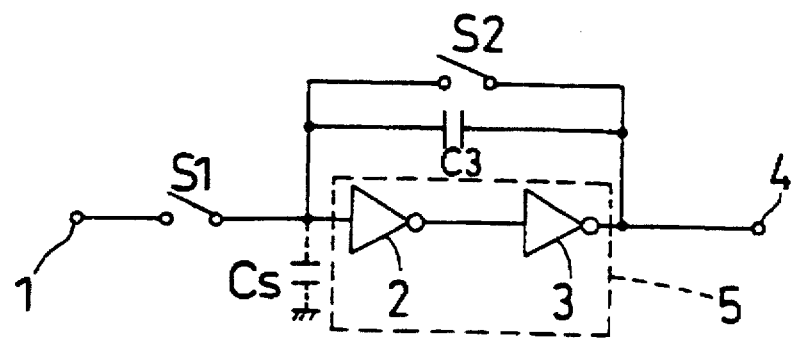
FIG. 17 illustrates a latch section of a sixth latch circuit in accordance with the present invention.

A sixth latch circuit of the present invention is described by making reference to FIG. 17.

FIG. 17 is a circuit diagram showing a latch section of the sixth latch circuit. Unlike the latch section of the fourth latch circuit in which the capacitor C1 is connected between the input and output terminals of the first inverter 2, the present latch section is characterized in that a capacitor C3 is connected between the input terminal of the first inverter 2 and the output terminal of the second inverter 3. Elements of FIG. 17, which are functionally equivalent to their counterparts of FIG. 15, are thus assigned the same reference numerals and they are not described in detail here accordingly.

The latch section of the sixth latch circuit may find applications either in the first latch circuit, in the second latch circuit, or in third latch circuit. However, a case where the present latch section is used in the second latch circuit is described here because the effect of the capacitor C3 is demonstrated most characteristically when employed in the second latch circuit (see FIG. 9).

In the sampling period, $V_{in}$ (the voltage applied at the external input terminal 1) is applied to one terminal of the capacitor C3 and $G^2 \times (V_{in}-V_a)+V_a$ is applied to the other terminal thereof. Therefore $q_S$ (i.e., the amount of electric charge held by the capacitor C3) is expressed as follows:

$$q_S = C3 \times (V_{in} - (G^2 \times (V_{in} - V_a) + V_a)) \quad (9)$$

where $G^2$ is the voltage gain of in-series circuits (the first and second inverters 2 and 3).

$q_{SS}$ (i.e., the amount of electric charge held by the parasitic capacitor Cs connected between the input terminal of the first inverter 2 and ground) is given as follows.

$$q_{SS} = C_s \times V_{in} \quad (10)$$

In the hold period, if the input voltage of the first inverter 2 is set to $V_H$, then $q_{SH}$ (the amount of electric charge distributed to the capacitor C3) is given as follows.

$$q_{SH} = C3 \times (V_H - (G^2 \times (V_H - V_a) + V_a)) \quad (11)$$

Further, $q_{SSH}$ (the amount of electric charge distributed to the parasitic capacitor Cs) is given as follows.

$$q_{SSH} = Cs \times V_H \quad (12)$$

Both in the sampling period and in the hold period, the conservation of charge holds at a point where the capacitor C3 and the parasitic capacitor Cs are connected together. Here, $q_r$ which is an amount of electric charge injected, at the time when a transition to a hold period is made, into the point by means of electric charge redistribution accompanied with movement between power sources of terminal voltages of parasitic capacitors in the switches S1 and S2, is added to a formula expressing the conservation of charge, for obtaining circuit characteristics as close as possible to actual ones.

$$q_s + q_{ss} + q_r = q_{sH} + q_{ssH} \quad (13)$$

Formulas (9)–(12) are substituted in Formula (13), to make an arrangement on the setting voltage $V_H$.

$$V_H = V_{in} + q_r/(Cs+(1-G^2) \times C3) \quad (14)$$

In the absence of the capacitor C3, C3=0 in the formula (9). Therefore:

$$V_H = V_{in} + q_r/Cs \quad (15)$$

The second terms of the right sides of the formulas (14) and (15), that is, $q_r/(Cs+(1-G^2) \times C3)$ and $q_r/Cs$, each represent an error voltage of $V_H$ versus $V_{in}$. As can be seen from comparing the formula (14) with the formula (15), the presence of the capacitor C3 reduces the value of error voltage. In other words, the capacitor C3 contributes to lowering an error voltage.

In actual latch circuits, there are variations in the parasitic capacitor Cs due to fabrication steps of the semiconductor integrated circuit. Because of this, the error voltage varies greatly. Conversely the capacitor C3 controls the parasitic capacitor Cs variation and can be formed having a greater value than the parasitic capacitor Cs. The presence of the capacitor C3 reduces the effect of the parasitic capacitor Cs. $V_H$ (the setting voltage) can be approximately expressed as follows.

$$V_H = V_{in} + q_r/((1-G^2) \times C3) \quad (\therefore Cs \ll (1-G^2) \times C3) \quad (16)$$

Therefore the error voltage of the second term of the right side becomes independent upon the parasitic capacitor Cs, whereupon the error voltage variation is reduced.

Thereafter the latch circuit performs a feedback operation according to the setting voltage $V_H$. In order to perform high-accuracy operations, the error voltage must be kept as low as possible.

In accordance with the sixth latch circuit, the capacitor C3 is connected between the input terminal of the first inverter 2 and the output terminal of the second inverter 3. As a result of such provision of the capacitor C3, the error voltage can be controlled in the hold period, and variations in the error voltage due to fabrication steps of the semiconductor integrated circuit can be controlled.

Embodiment 7

Figure 18:
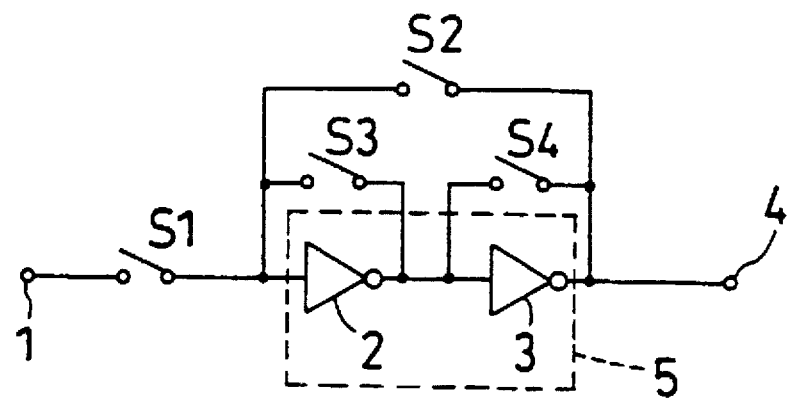
FIG. 18 illustrates a latch section of a seventh latch circuit in accordance with the present invention.

A seventh latch circuit of the present invention is described by making reference to FIG. 18.

FIG. 18 is a circuit diagram showing the seventh latch circuit. 1 is an external input terminal. 2 is a first inverter. 3 is a second inverter. 4 is an external output terminal. S1 is an input switch acting as a first switch means. S2 is a feedback switch acting as a second switch means. S3 is a first bias switch acting as a third switch means. S4 is a second bias switch acting as a fourth switch means. 5 is a noninverting amplifier made up of the first and second inverters 2 and 3.

The input switch S1 is connected between the external input terminal 1 and an input terminal of the first inverter 2. When the input switch S1 has an on state, an input voltage applied at the external input terminal 1 is fed to the first inverter 2. The first inverter 2 is associated with the input switch S1 and acts as an amplifier for inversion-amplifying an input voltage. The second inverter 3 is connected in series to the first inverter 2 and acts as an inverting amplifier for inversion-amplifying an output voltage of the first inverter 2. The feedback switch S2 is connected between the input terminal of the first inverter 2 and the output terminal of the second inverter 3. When the feedback switch S2 has an on state, an output voltage of the second inverter 3 is fed back in a positive feedback manner to the first inverter 2.

Connected between the input and output terminals of the first inverter 2 is the first bias switch S3. In other words, the first bias switch S3 is operable to establish connection or disconnection between the input and output terminals of the first inverter 2. The second bias switch S4 is connected between the input and output terminals of the second inverter 3. In other words, the second bias switch S4 is operable to establish connection or disconnection between the input and output terminals of the second inverter 3.

The operation of the seventh latch circuit is described by making reference to FIG. 19a.

FIG. 19a is a timing diagram showing the operation of the FIG. 18 latch circuit. In the sampling period, the input switch S1 has an on state while on the other hand the feedback switch S2, the first bias switch S3, and the second bias switch S4 each have an off state. At this point in time, a voltage of $V_{in}$, applied at the external input terminal 1, is supplied to the input terminal of the first inverter 2 via the input switch S1. Based on $V_a$ (the first inverter's 2 threshold voltage), the first inverter 2 inversion-amplifies the input voltage $V_{in}$. This inversion-amplified voltage is further inversion-amplified by the second inverter 3 and is put out. An input voltage of the first inverter 2 and an output voltage of the second inverter 3 have the same polarity on the basis of $V_a$.

In the feedback period, the input switch S1 has an off state while the feedback switch S2 has an on state. The first and second bias switches S3 and S4 each remain off. In this situation, an output voltage of the second inverter 3 is fed back, in a positive feedback manner, to the input terminal of the first inverter 2 via the feedback switch S2 that is now in the on state. Because of such positive feedback, an input voltage of the first inverter 2 and an output voltage of the second inverter 3 are driven to the supply or ground voltage. Therefore a voltage, applied at the end of the sampling period, is driven to the supply or ground voltage on the basis of $V_a$ (i.e., the threshold voltage of the first inverter 2), and is put out at the external output terminal 4.

In the bias period, the input switch S1 has an off state while the feedback switch S2 has an on state. The first and second bias switches S3 and S4 each make an off→on transition. $V_a$ is biased by the first and second bias switches S3 and S4 to the input and output terminals of the first inverter 2 and to the input and output terminals of the second inverter 3. Then, a voltage, held by the latch circuit in the preceding feedback period, makes a transition to $V_a$, and the settling time taken for setting a voltage applied at the external input terminal to a final voltage in a sampling period is not affected by a difference in the voltage held by the latch circuit in the preceding feedback period.

The latch circuit of the present embodiment may be used as a latch section in the first, second, or third latch circuit. Here, the present latch circuit is applied as a latch section to the first latch circuit of FIG. 3 and the operation thereof is shown in FIG. 19b. As seen from FIG. 19b, the operation of this latch circuit is a combination of the operation of the first latch circuit and the operation of the present latch circuit. In the separation period, $V_a$ is biased by the first and second bias switches S3 and S4 to the input and output terminals of the first inverter 2 and to the input and output terminals of the second inverter 3.

Embodiment 8

Figure 20:
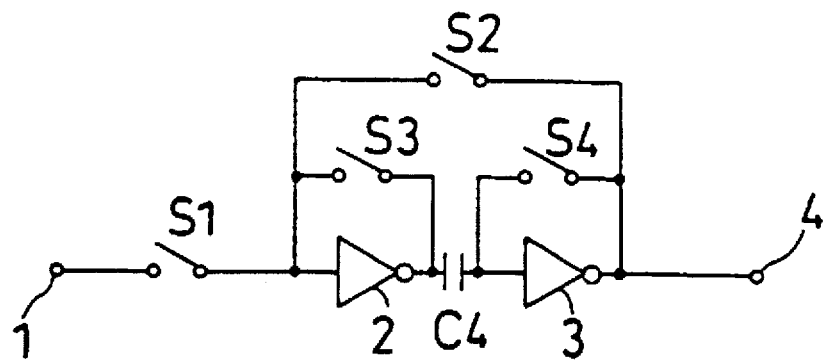
FIG. 20 is a circuit diagram showing an eighth latch circuit in accordance with the present invention.

An eighth latch circuit of the present invention is described by making reference to FIG. 20.

FIG. 20 is a circuit diagram showing the eighth latch circuit. The eighth latch circuit is identical in configuration with the seventh latch circuit of FIG. 18 except that the eighth latch circuit is provided with a capacitor C4 for holding a difference between $V_{af}$ (the first inverter's 2 threshold voltage) and $V_{as}$ (the second inverter's 3 threshold voltage). As shown in FIG. 20, the capacitor C4 is connected between the output terminal of the first inverter 2 and the input terminal of the second inverter 3. Elements of FIG. 20, which are functionally equivalent to their counterparts of FIG. 18, are thus assigned the same reference numerals and they are not described in detail here.

Here, the inverter threshold voltage variation due to the process variation in actual circuits is considered. The capacitor C4 is operable to reduce the degree of such threshold voltage variation.

Figure 21:
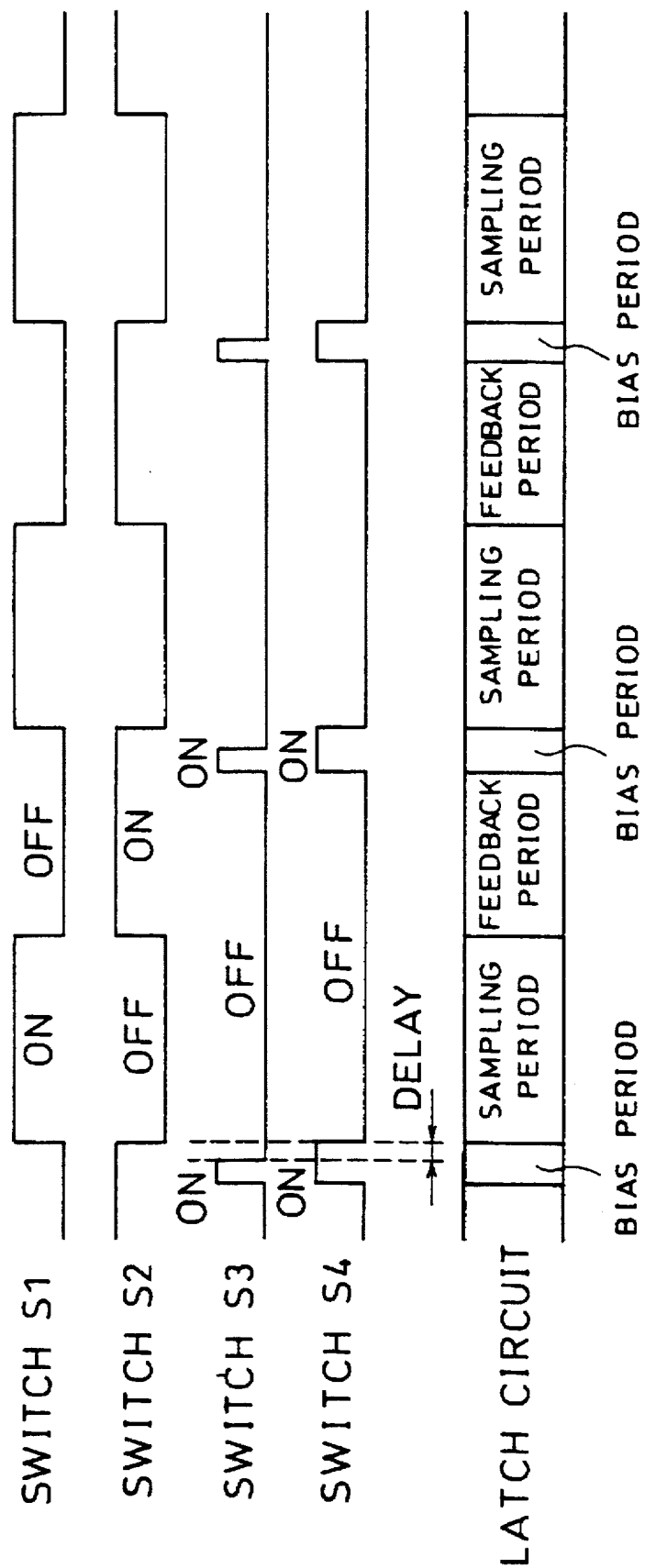
FIG. 21 is a timing diagram useful in understanding the operation of the eighth latch circuit.
Figure 22:
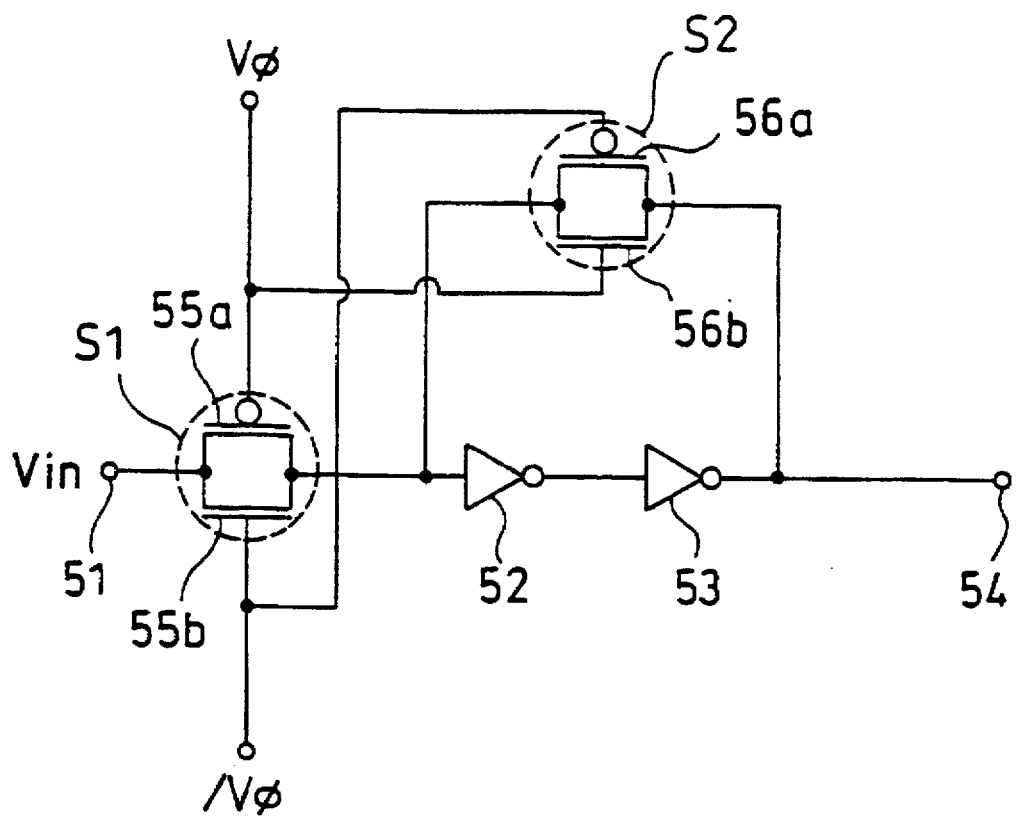
FIG. 22 is a circuit diagram showing a conventional latch circuit structure.
Figure 24:
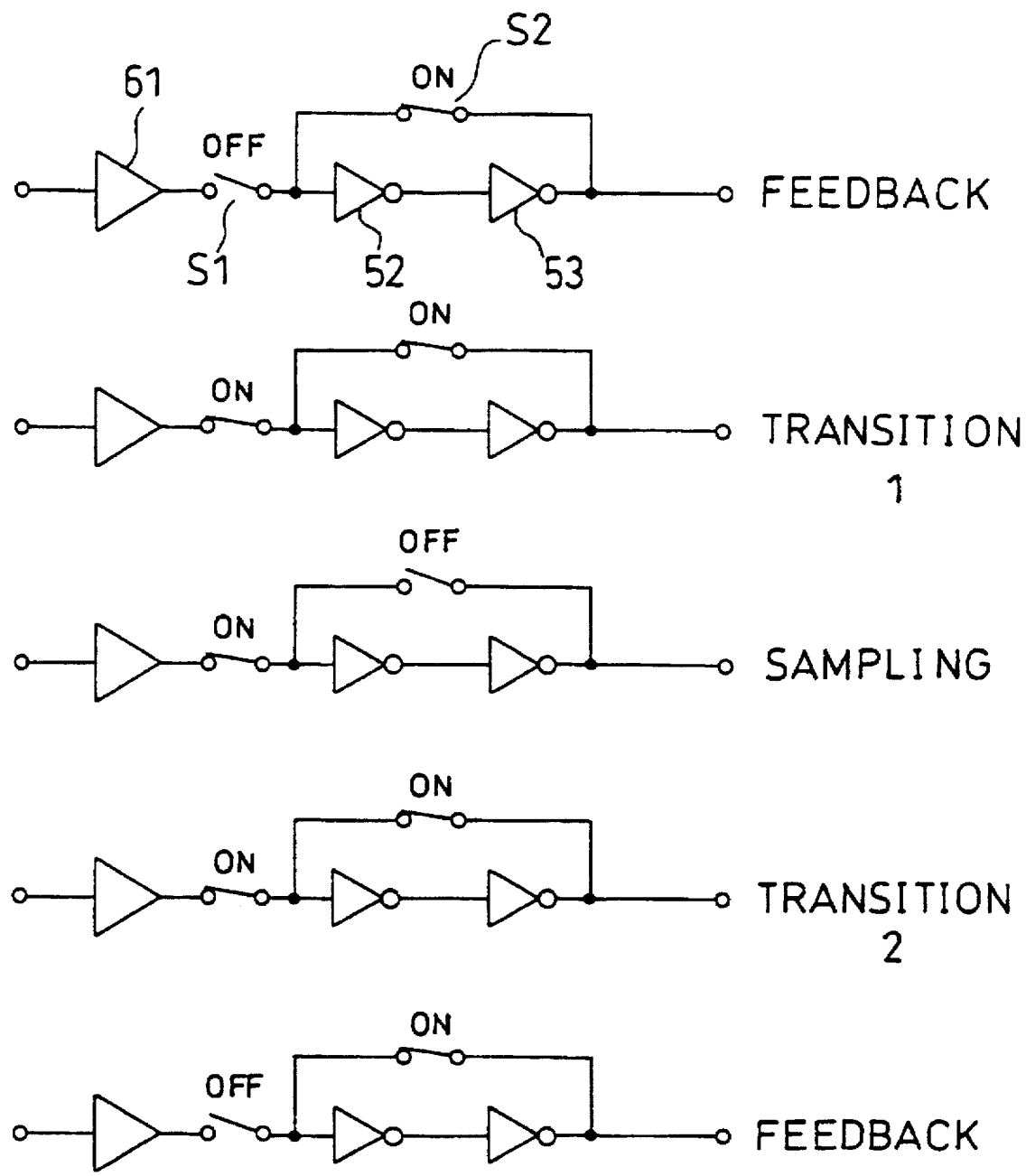
FIG. 24 is a diagram showing the operation of a conventional latch circuit.
Figure 25:
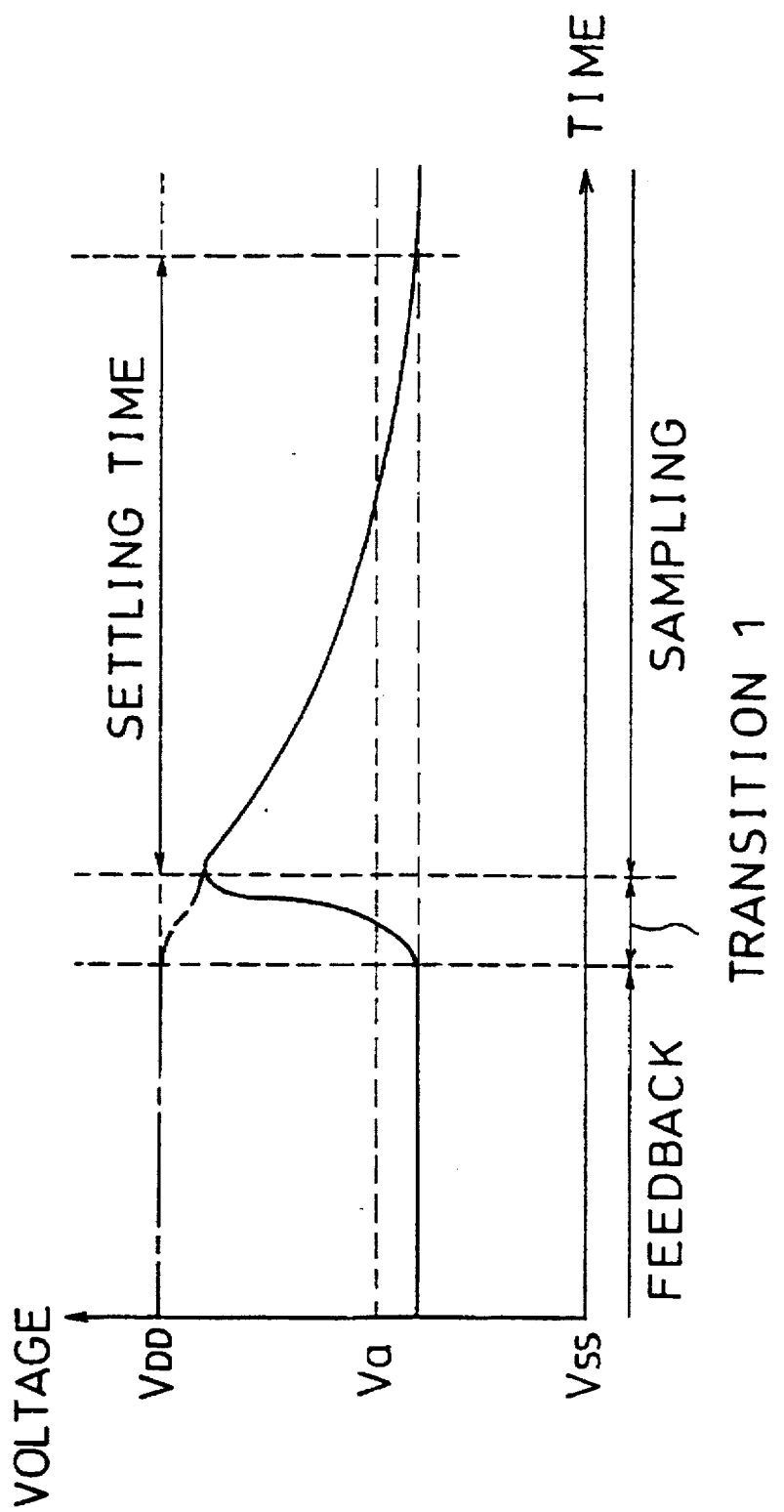
FIG. 25 is a graph showing changes in the output voltage of an amplifier 61 in the operation of a conventional latch circuit.
Figure 26:
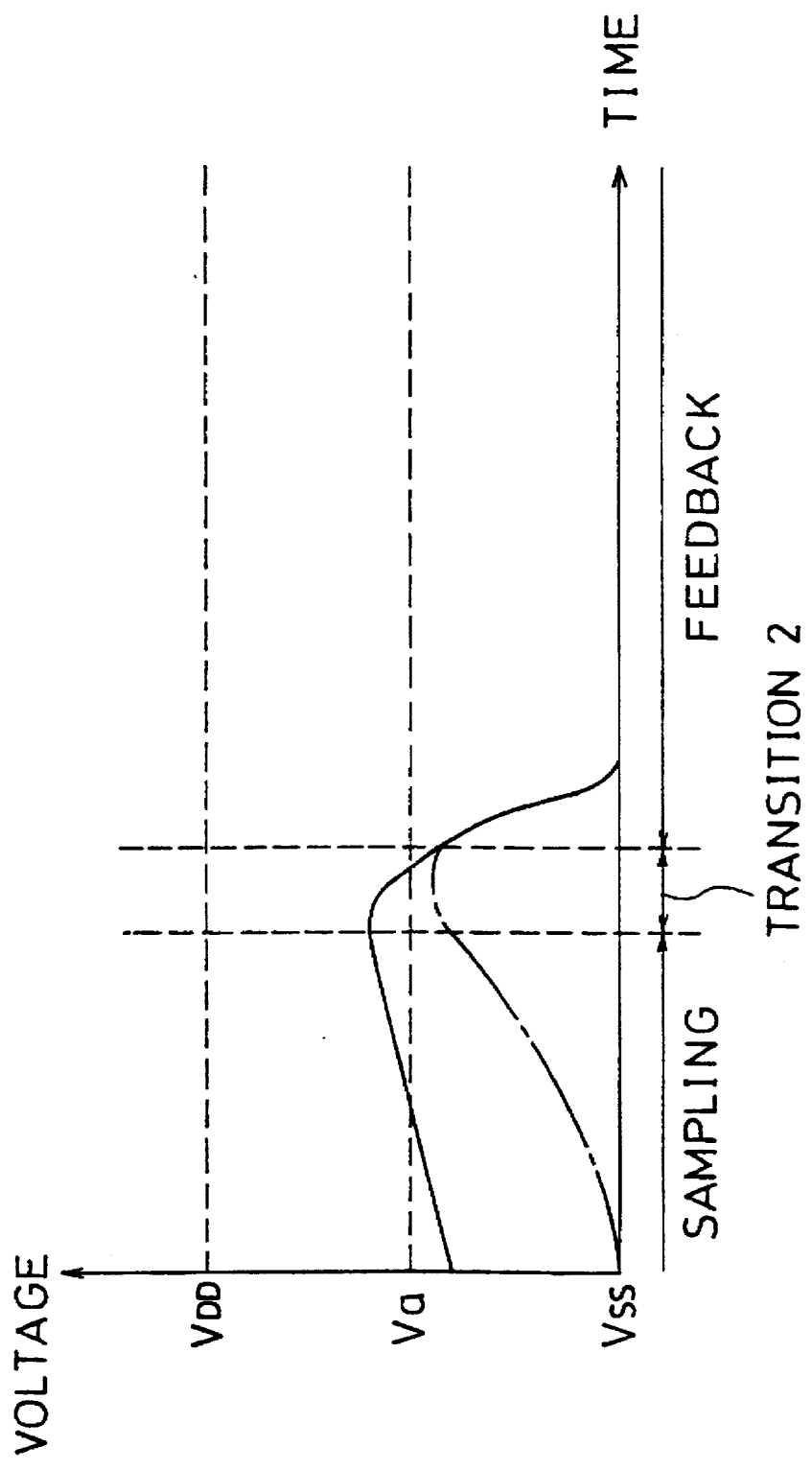
FIG. 26 is a graph showing changes in the input voltage of a first inverter 52 in the operation of a conventional latch circuit.

FIG. 21 is a timing diagram showing the operation of the eighth latch circuit. Since the sampling period operation and the feedback period operation are the same as those in the seventh embodiment, they are not described here in detail. A feature of the eighth latch circuit lies in the bias period operation. As shown in FIG. 21, when the present latch circuit goes into the bias period, the first and second bias switches S3, S4 each have an on state. As a result, $V_{af}$ and $V_{as}$ are biased to the first and second inverters 2 and 3, respectively. In the second half of the bias period, the first bias switch S3 makes an on→off transition while the second bias switch S4 remains on. Thereafter the second bias switch S4 makes an on→off transition. Because of such operations, a difference between $V_{af}$ and $V_{as}$ is held in the capacitor C4. This controls possible affection due to the threshold voltage variation thereby increasing the accuracy of latch circuit operation.

If any one of the first to eighth latch circuits is applied to A/D converters, this improves the performance of an A/D converter (e.g., the differential non-linearity and the integral non-linearity).

What is claimed is:

1. A latch for amplifying and converting an analog signal into a digital signal, comprising:

an external input terminal for accepting an analog signal voltage coming in from outside said latch circuit;

a noninverting amplifier with an input terminal and an output terminal for amplifying said analog signal voltage in a noninverting amplification manner;

a first switch means which is connected between said external input terminal and said input terminal of said noninverting amplifier and which is capable of having either an on state for establishing a connection between said external input terminal and said input terminal of said noninverting amplifier or an off state for establishing a disconnection between said external input terminal and said input terminal of said noninverting amplifier;

a second switch means which is connected between said input terminal and said output terminal of said noninverting amplifier and which is capable of having either an on state for establishing a connection between said input and output terminals of said noninverting amplifier or an off state for establishing a disconnection between said input and output terminals of said noninverting amplifier;

control means for controlling the on/off state of said first switch means and the on/off state of said second switch means in such a way as to prevent both said first switch means and said second switch means from having an on state at the same time when said first switch means and said second switch means together make respective state transitions, wherein said input terminal of said noninverting amplifier has a floating state when both said first switch means and said second switch means have the off state at the same time.

2. A latch circuit according to claim 1,
said control means including:
  a first drive means for driving said first switch means for setting the state thereof;
  a second drive means for driving said second switch means for setting the state thereof;
  a delay means for receiving a first signal and delaying same to generate a second signal;
  a signal generation means which receives said first signal and said second signal, to generate a third signal prompting said first switch means to change state, said generated third signal being forwarded to said first drive means, and to generate a fourth signal prompting said second switch means to change state, said generated fourth signal being forwarded to said second drive means.

3. A latch circuit according to claim 1,
said control means exerting control when a state transition is made from a first state in which said first switch means has an off state while said second switch means has an on state to a second state in which said first switch means has an on state while said second switch means has an off state, in order that said first→second state transition is made by way of a third state in which said first switch means and said second switch means each have an off state.

4. A latch circuit according to claim 1,
said control means exerting control when a state transition is made from a first state in which said first switch means has an on state while said second switch means has an off state to a second state in which said first switch means has an off state while said second switch means has an on state, in order that said first→second state transition is made by way of a third state in which said first switch means and said second switch means each have an off state.

5. A latch circuit according to claim 1,
said control means exerting control when a state transition is made from a first state in which said first switch means has an off state while said second switch means has an on state to a second state in which said first switch means has an on state while said second switch means has an off state, in order that said first→second state transition is made by way of a third state in which said first switch means and said second switch means each have an off state;

said control means exerting further control when a state transition is made from said second state to said first state, in order that said second→first state transition is made by way of said third state.

6. A latch circuit according to claim 1, said noninverting amplifier comprising an even number of inverting amplifiers connected in series; and said latch circuit including a capacitor with two terminals, one of which is connected to an input terminal of a first-stage inverting amplifier of said even number of inverting amplifiers and the other of which is connected to an output terminal of said first-stage inverting amplifier.

7. A latch circuit according to claim 6, said latch circuit further including another capacitor with two terminals, one of which is connected to an input terminal of a last-stage inverting amplifier of said even number of inverting amplifiers and the other of which is connected to an output terminal of said last-stage inverting amplifier.

8. A latch circuit according to claim 1, said latch circuit further including a capacitor with two terminals, one of which is connected to an input terminal of said noninverting amplifier and the other of which is connected to an output terminal of said noninverting amplifier.

9. A latch circuit for amplifying and converting an analog signal into a digital signal, comprising:
  an external input terminal for accepting an analog signal voltage coming in from outside said latch circuit;
  a noninverting amplifier with an input terminal and an output terminal for amplifying said analog signal voltage in a noninverting amplification manner, consisting of N inverting amplifiers connected in series, where the number N is even, for amplifying said voltage in a noninverting amplification manner;
  a first switch means which is connected between said external input terminal and said input terminal of said noninverting amplifier and which is capable of having either an on state for establishing a connection between said external input terminal and said input terminal of said noninverting amplifier or an off state for establishing a disconnection between said external input terminal and said input terminal said noninverting amplifier;
  a second switch means which is connected between said input terminal and said output terminal of said noninverting amplifier and which is capable of having either an on state for establishing a connection between said input and output terminals of said noninverting amplifier or an off state for establishing a disconnection between said input and output terminals of said noninverting amplifier;
  N bias switch means each of which is connected between an input terminal and an output terminal of each said inverting amplifier, each said bias switch means being capable of having either an on state for establishing a connection between an input and an output terminal of each said inverting amplifier or an off state for establishing a disconnection between an input and an output terminal of each said inverting amplifier,
  wherein said input terminal of said noninverting amplifier has a floating state when both said first switch means and said second switch means have the off state at the same time.

10. A latch circuit according to claim 9,
said latch circuit further including a control means for controlling the on/off state of said first switch means and the on/off state of said second switch means in such a way as to prevent both said first switch means and said second switch means from having an on state at the same time when said first switch means and said second switch means together make their respective state transitions.

11. A latch circuit according to claim 9, said noninverting amplifier further including (N−1) capacitors connected in series between an output terminal of an ith-stage inverting amplifier of said N inverting amplifiers and an input terminal of an (i+1) th-stage inverting amplifier of said N inverting amplifiers, where the number i is an integer satisfying a condition of $1 \leq i \leq (N-1)$.

12. A latch circuit comprising:

an external input terminal for accepting a voltage coming in from outside said latch circuit;

a noninverting amplifier with an input terminal and an output terminal for amplifying said voltage in a noninverting amplification manner;

a first switch means which is connected between said external input terminal and said input terminal of said noninverting amplifier and which is capable of having either an on state for establishing a connection between said external input terminal and said input terminal of said noninverting amplifier or an off state for establishing a connection between said external input terminal of said noninverting amplifier or an off state for establishing a disconnection between said external input terminal of said noninverting amplifier;

a second switch means which is connected between said input terminal and said output terminal of said noninverting amplifier and which is capable of having either an on state for establishing a connection between said input and output terminals of said noninverting amplifier or an off state for establishing a disconnection between said input and output terminals of said noninverting amplifier; and a control means for controlling said first switch means and said second switch means so that said first switch means and said second switch means exchange between the on state and the off state in a predetermined sequence.

13. A latch circuit for amplifying and converting an analog signal into a digital signal, comprising:

an external input terminal for accepting an analog signal voltage coming in from outside said latch circuit;

a noninverting amplifier with an input terminal and an output terminal for amplifying said analog signal voltage in a noninverting amplification manner;

a first switch means that is connected between said external input terminal and said input terminal of said noninverting amplifier and which is capable of having either an on state for establishing a connection between said external input terminal and said input terminal of said noninverting amplifier or an off state for establishing a disconnection between said external input terminal and said input terminal of said noninverting amplifier;

a second switch means that is connected between said input terminal and said output terminal of said noninverting amplifier and which is capable of having either an on state for establishing a connection between said input and output terminals of said noninverting amplifier or an off state for establishing a disconnection between said input and output terminals of said noninverting amplifier; and control means for controlling the on/off state of said first switch means and the on/off state of said second switch means, wherein said control means controls the on/off state of said first switch means and the on/off state of said second switch means when a state transition is made from a first state in which said first switch means has an off state while said second switch means has an on state to a second state in which said first switch means has an on state while said second switch means has an off state, in order that said first-to-second state transition is made by way of a third state in which said first switch means and said second switch means each have an off state.

14. A latch circuit for amplifying and converting an analog signal into a digital signal, comprising:

an external input terminal for accepting an analog signal voltage coming in from outside said latch circuit;

a noninverting amplifier with an input terminal and an output terminal for amplifying said analog signal voltage in a noninverting amplification manner, consisting of N inverting amplifiers connected in series, where the number N is even, for amplifying said voltage in a noninverting amplification manner;

a first switch means that is connected between said external input terminal and said input terminal of said noninverting amplifier and which is capable of having either an on state for establishing a connection between said external input terminal and said input terminal of said noninverting amplifier or an off state for establishing a disconnection between said external input terminal and said input terminal of said noninverting amplifier;

a second switch means that is connected between said input terminal and said output terminal of said noninverting amplifier and which is capable of having either an on state for establishing a connection between said input and output terminals of said noninverting amplifier or an off state for establishing a disconnection between said input and output terminals of said noninverting amplifier; and N bias switch means, wherein each said N bias switch means is connected between an input terminal and output terminal of each said inverting amplifier, and wherein each said bias switch means is capable of having either an on state for establishing a connection between an input terminal and an output terminal of each said inverting amplifier or an off state for establishing a disconnection between an input terminal and an output terminal of each said inverting amplifier.

* * * * *